United States Patent
Inoue et al.

(10) Patent No.: US 7,613,048 B2
(45) Date of Patent: Nov. 3, 2009

(54) NONVOLATILE SEMICONDUCTOR MEMORY DEVICE AND NONVOLATILE MEMORY SYSTEM

(75) Inventors: Atsushi Inoue, Tokyo (JP); Toshifumi Shano, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 156 days.

(21) Appl. No.: 11/934,330

(22) Filed: Nov. 2, 2007

(65) Prior Publication Data

US 2008/0106946 A1 May 8, 2008

(30) Foreign Application Priority Data

Nov. 2, 2006 (JP) .............. 2006-299572

(51) Int. Cl.
*G11C 16/04* (2006.01)
(52) U.S. Cl. .............. 365/185.24; 365/185.28; 365/185.17; 365/185.09
(58) Field of Classification Search ............ 365/185.28, 365/185.17, 185.24, 189.09
See application file for complete search history.

(56) References Cited

U.S. PATENT DOCUMENTS

| | | | |
|---|---|---|---|
| 6,134,148 A | 10/2000 | Kawahara et al. | |
| 6,643,188 B2 | 11/2003 | Tanaka et al. | |
| 6,958,936 B2 * | 10/2005 | Quader et al. | .......... 365/185.17 |
| 7,173,859 B2 | 2/2007 | Hemink | |
| 2007/0081388 A1 | 4/2007 | Joo | |

FOREIGN PATENT DOCUMENTS

| | | |
|---|---|---|
| JP | 2003-196988 | 7/2003 |
| KR | 1020070039720 A | 4/2007 |

* cited by examiner

*Primary Examiner*—Hoai V Ho
*Assistant Examiner*—Jason Lappas
(74) *Attorney, Agent, or Firm*—Oblon, Spivak, McClelland, Maier & Neustadt, L.L.P.

(57) ABSTRACT

A nonvolatile semiconductor memory device including a memory cell array including a plurality of electrically rewritable nonvolatile memory cells arranged in series, the memory cell storing data using a plurality of threshold levels, a threshold level storage section storing a programming method switch threshold level on which a first programming method and a second programming method are switched, a comparison circuit comparing the programming method switch threshold level with a programming data threshold level and outputting a comparison result, a control signal generation circuit setting the first programming method or the second programming method based on the comparison result and outputting a control signal corresponding to the first programming method or the second programming method and a voltage generation circuit generating a programming voltage and an intermediate voltage which are applied to the memory cell based on the control signal.

20 Claims, 14 Drawing Sheets

PROGRAMMING CELL

NONVOLATILE SEMICONDUCTOR MEMORY DEVICE AND NONVOLATILE MEMORY SYSTEM

CROSS REFERENCE TO RELATED APPLICATION

This application is based upon and claims the benefit of priority from the prior Japanese Patent Application No. 2006-299572, filed on Nov. 2, 2006; the entire contents of which are incorporated herein by reference.

BACKGROUND OF THE INVENTION

Field of the Invention

This invention relates to a nonvolatile semiconductor memory device which is formed using electrically rewritable nonvolatile memory cells and a nonvolatile memory system.

Conventionally, a NAND type flash memory using an EEPROM has been proposed as an electrically rewritable nonvolatile semiconductor memory device. In recent years, in order to further realize large capacity flash memories, various multi-level memory methods where one memory cell stores multi bits has been proposed.

A multi-level memory method uses a wide range voltage region from a low voltage region to a high voltage region as a threshold which is divided into multiple parts. In the case of setting a threshold to/in a higher voltage region, there is a need to apply a higher programming voltage.

In addition, because the multi-level memory method controls a threshold in multiple parts, there is a need to narrow the width of a cell's threshold distribution.

In order to narrow the width of a threshold distribution after programming, a nonvolatile semiconductor memory device arranged with a programming control means is proposed in Japanese Patent Application Laid-Open Publication No. 2003-196988. In this means, a programming voltage Vpgm and an intermediate voltage Vreg are supplied and programming to the memory is performed, then when a memory cell reaches a first programming state, the value of the intermediate voltage is changed and programming to the memory cell is performed, and when the memory cell reaches a second programming state, the value of the intermediate voltage Vreg is changed to Vdd and the programming control means forbids programming to the memory cell.

However, in the case where a high voltage region is set as a threshold to a memory cell to be programmed, the following phenomenon occurs when programming of a memory cell which is adjacent to this memory cell on the same word line is already completed and when this threshold value is in a low voltage region and when a high voltage programming voltage is applied to a word line of a memory cell to be programmed. Because the same high voltage is also applied over a long period to the word line of an adjacent memory cell in which programming has already finished, the threshold which was in a low voltage region of the adjacent memory cell receives is affected and rises. This phenomenon is called program disturb.

The threshold of this adjacent memory cell transits to a high voltage side due to program disturb and when the threshold range corresponding to a data value which is first programmed, is exceeded, there is a possibility that programming errors will occur.

BRIEF SUMMARY OF THE INVENTION

A nonvolatile semiconductor memory device related to an embodiment of the present invention includes; a memory cell array including a plurality of electrically rewritable nonvolatile memory cells arranged in series, said memory cell storing data using a plurality of threshold levels; a threshold level storage section storing a programming method switch threshold level on which a first programming method and a second programming method are switched; a comparison circuit comparing said programming method switch threshold level with a programming data threshold level and outputting a comparison result; a control signal generation circuit setting said first programming method or said second programming method based on said comparison result and outputting a control signal corresponding to said first programming method or said second programming method; and a voltage generation circuit generating a programming voltage and an intermediate voltage which are applied to said memory cell based on said control signal.

A nonvolatile semiconductor memory device related to an embodiment of the present invention includes; a memory cell array including a plurality of electrically rewritable nonvolatile memory cells arranged in series, said memory cell storing data using a plurality of threshold levels; a number of times storage section storing a programming method switch number of step-up-times on which a first programming method and a second programming method are switched; a counter circuit counting a number of step-up-times when a programming voltage applied to said memory cell is stepped up and outputting said number of step-up-times; a comparison circuit comparing said number of step-up-times with said programming method switch number of step-up-times and outputting a comparison result; a control signal generation circuit sets said first programming method or said second programming method based on a comparison result and outputting a control signal corresponding to said first programming method or said second programming method; and a voltage generation circuit generating said programming voltage and an intermediate voltage which are applied to said memory cell based on said control signal.

A nonvolatile memory system related to an embodiment of the present invention includes; a memory cell array including a plurality of electrically rewritable nonvolatile memory cells arranged in series, said memory cell storing data using a plurality of threshold levels; a threshold level storage section storing a programming method switch threshold level on which a first programming method and a second programming method are switched; a comparison circuit comparing said programming method switch threshold level with a programming data threshold level and outputting a comparison result; a control signal generation circuit setting said first programming method or said second programming method based on said comparison result and outputting a control signal corresponding to said first programming method or said second programming method; a voltage generation circuit generating a programming voltage and an intermediate voltage which are applied to said memory cell based on said control signal; and an external controller changing said programming method switch threshold level stored in said threshold level storage section according to a command inputted from an system apparatus.

DETAILED DESCRIPTION OF THE INVENTION

Figure 1:
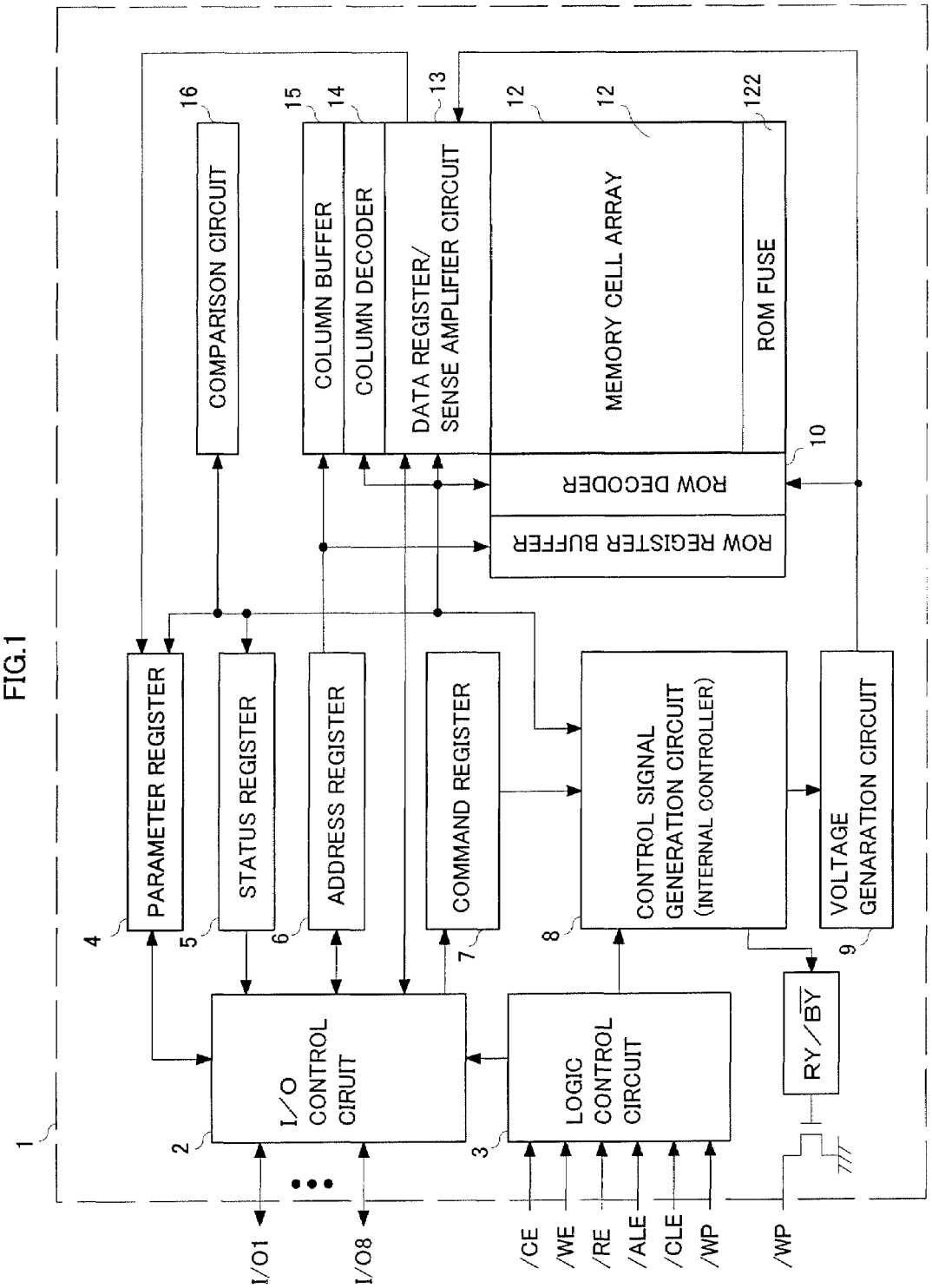
FIG. 1 is a drawing which shows a function block construction of a memory chip of a NAND type flash memory related to an embodiment 1 of this invention.

Embodiments of the present invention will be explained in detail below while referring to the drawings. However, it is possible to realize the present invention with many different embodiments and thus the present invention is not limited to the contents of the embodiments shown below.

Embodiment 1

Figure 2:
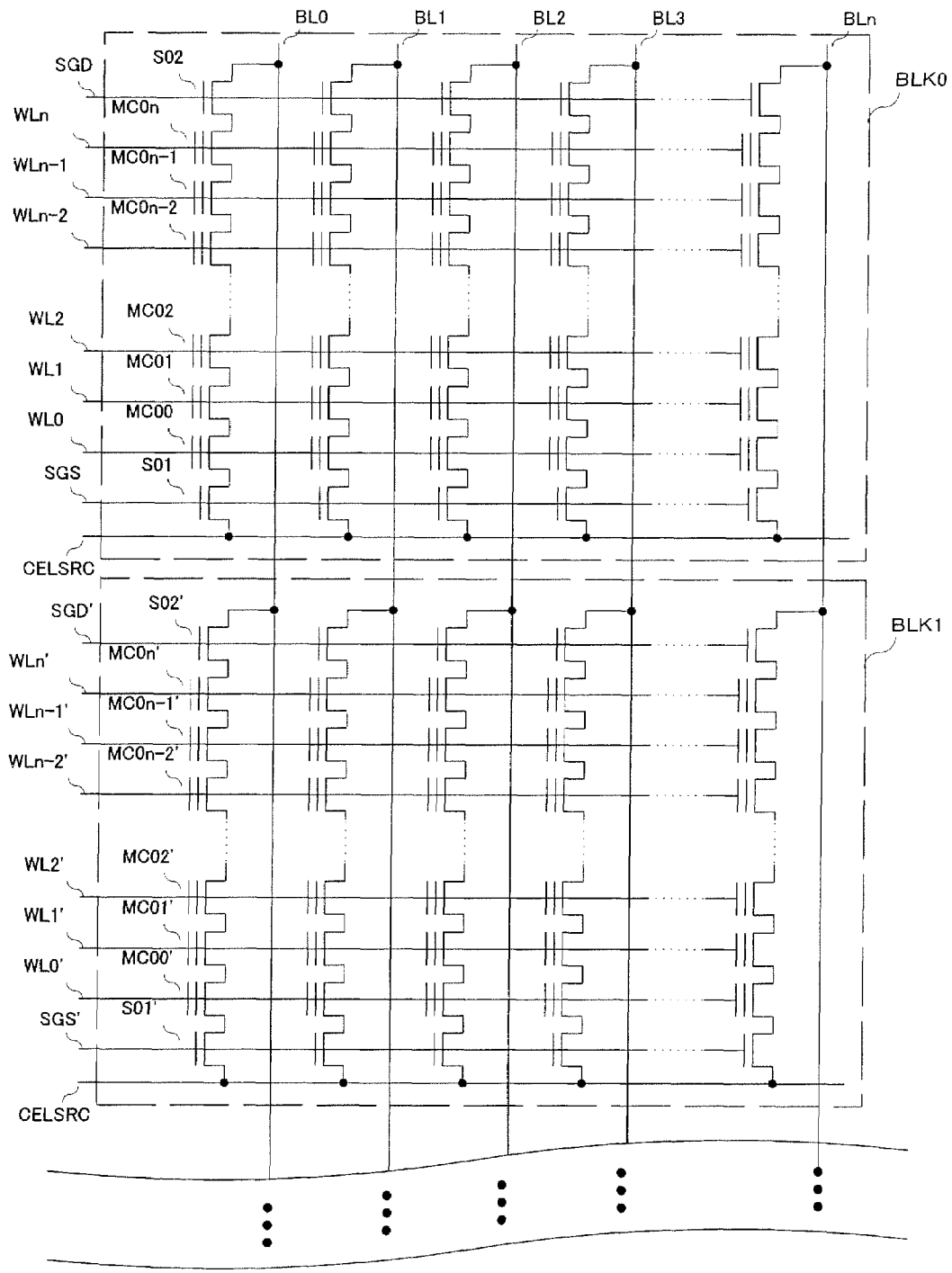
FIG. 2 is a drawing which shows an arrangement of memory cells in a memory cell array related to an embodiment 1 of this invention.

FIG. 1 is drawing which shows a function block construction of a memory chip of a NAND type flash memory related to an embodiment 1 of this invention. FIG. 2 is a drawing which shows an arrangement of memory cells in a memory cell array 12. The memory cell array 12 is formed from an arrangement of NAND cell units as shown in FIG. 2. Each NAND cell unit includes a plurality of (n in FIG. 2) of electrically rewritable nonvolatile memory cells MC00 to MC0$n$ and select gate transistors S01 and S02 for connecting both ends of each of these serially-connected memory cells respectively to a bit line BL and a source line CELSRC.

The control gates of the memory cells MC00 to MC0$n$ are each connected respectively to different word lines WL0 to WL$n$. The gates of the select gate transistors S01 and S02 are connected to select gate line SGD and SGS which are parallel to a word line WL.

A group of NAND cell units which share a word line are formed from blocks BLK which become a unit of data erasure. A plurality of blocks BLK0, BLK1, . . . are arranged in series in bit lines direction as shown in FIG. 2.

A row decoder 10 includes a word line drive circuit that selects and drives word lines in memory cell array 12.

A column decoder 14 selects bit lines BL. A data register/sense amplifier circuit 13 is connected to bit lines BL of the memory cell array 12. The data register/sense amplifier circuit 13 includes a function which programs and reads data to the memory cell array 12 via data register which temporarily stores input and output data, and a data latch function which stores programming data and read data.

When reading data, the data which is read from the data register/sense amplifier circuit 13 is output to an external input output terminal I/O1 to I/O8 via an I/O control circuit 2.

When programming data, the programming data which is supplied to the input output terminal I/O1 to I/O8 from an external controller is loaded into the data register/sense amplifier circuit 13 via the I/O control circuit 2.

A command which is supplied from the input output terminal I/O1 to I/O8 via the I/O control circuit 2 is decoded by a control signal generation circuit (internal controller) via a command register 7. External control signals such as a chip enable signal C/E, a program enable signal /WE, a read enable signal /RE, an address latch enable signal ALE and a command enable signal CLE are supplied to the control signal generation circuit 8 via an logic control circuit 3. The control signal generation circuit 8 controls the sequence of data programming and erasure and data reading based on an external control signal and command which are supplied in accordance with an operation mode.

A status register 5 is a register which stores various data for externally notifying the various states within a chip. The status register 5 includes a ready/busy register which stores data which shows whether a chip is in a ready or busy state, a programming status register which stores data which shows a pass or failure of programming, a programming error status register which stores data which shows the presence of a programming error state (pass or fail verification of programming error), and an overwriting status register which stores data which shows the presence of an overwriting state (pass or fail verification of overwriting).

A ROM fuse 122 is formed, for example, by memory cell which has the same construction as a memory cell within the memory cell array 12. The ROM fuse 122 may also be formed in a different region to the memory cell array 12 and may also be set in one part within the memory cell array 12. In FIG. 1 a first memory region 121 and a second memory region are arranged within the memory cell array 12. This first memory region 121 memorizes usual data and the second memory region memorizes data which is different to usual data as a ROM fuse 122. In embodiment 1 of the present invention the ROM fuse 122 is used as a threshold level storage section.

In the memory cell array 12 or the row decoder 10, various high voltages Vpp (a programming voltage Vpgm, a verify voltage Vr, a programming pass voltage Vpass and a read voltage Vread etc.) are needed in accordance with an operation mode. A voltage generation circuit 9 is arranged in order to generate these high voltages Vpp. The voltage generation circuit 9 is controlled by the control signal generation circuit 8.

Figure 3:
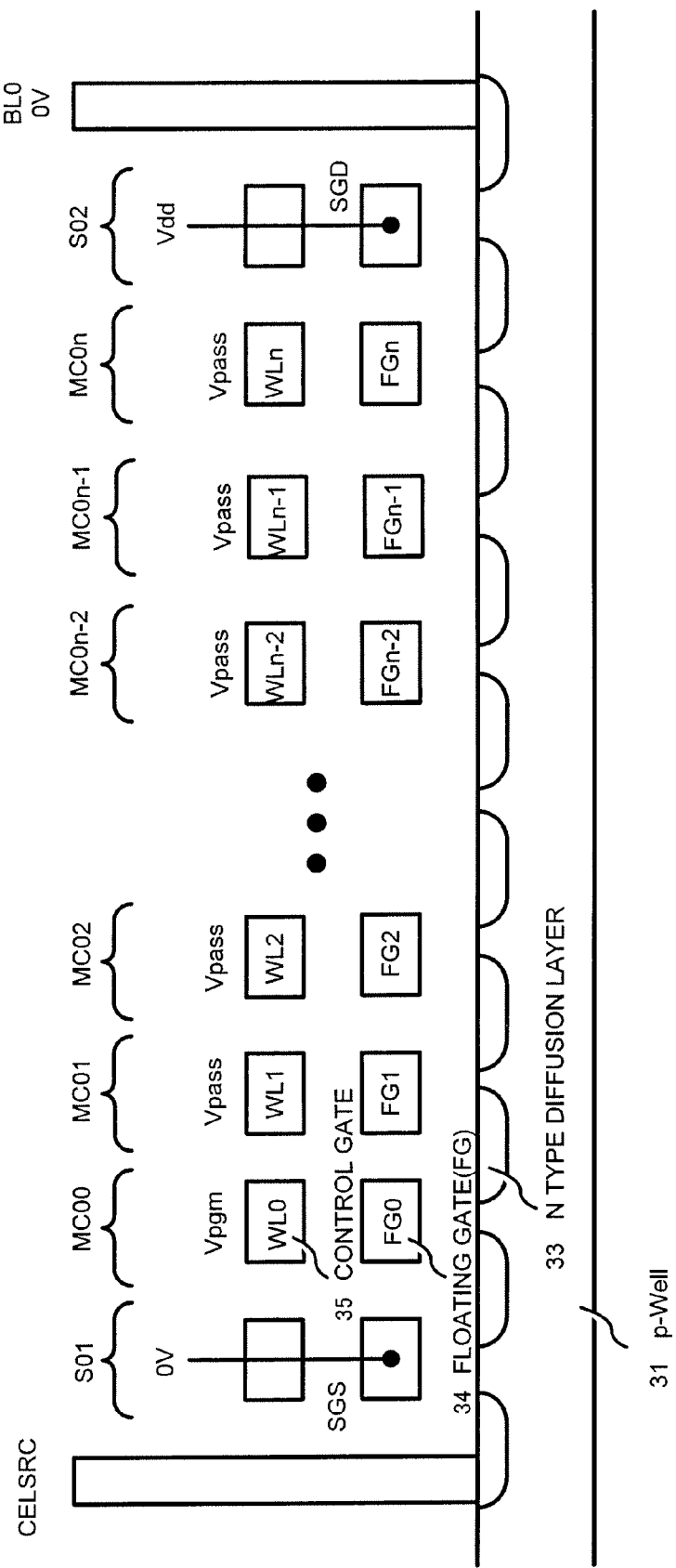
FIG. 3 is a cross-section drawing which shows one example of a construction of a memory cell part/section of a NAND type flash memory related to an embodiment 1 of this invention.

Next, the programming operation of a memory cell in a NAND type flash memory 1 will be explained. FIG. 3 is a cross-section drawing which shows one example of a construction of a memory cell part of a NAND type flash memory 1. A basic unit of a memory cell section of the NAND type flash memory 1 is formed from the plurality of memory cells MC00 to MC0n which are connected in series and the two select gate transistors S01 and S02. The select gate transistor S02 is connected to a bit line BL0 and the select gate transistor S01 is connected to a common source line CELSRC inside a memory cell. One memory cell includes a control gate 35 connected to a word line and a floating gate 34, and a source/drain consisting of an N type diffusion layer 33 which is formed on a p type well (p-Well). By controlling a programming voltage Vpgm which is applied to a word line and its application time and by changing the amount of electrons which accumulate in the floating gate (FG) 34, the threshold distribution (Vt) of a memory cell is changed and multi-level data is memorized.

Figure 4:
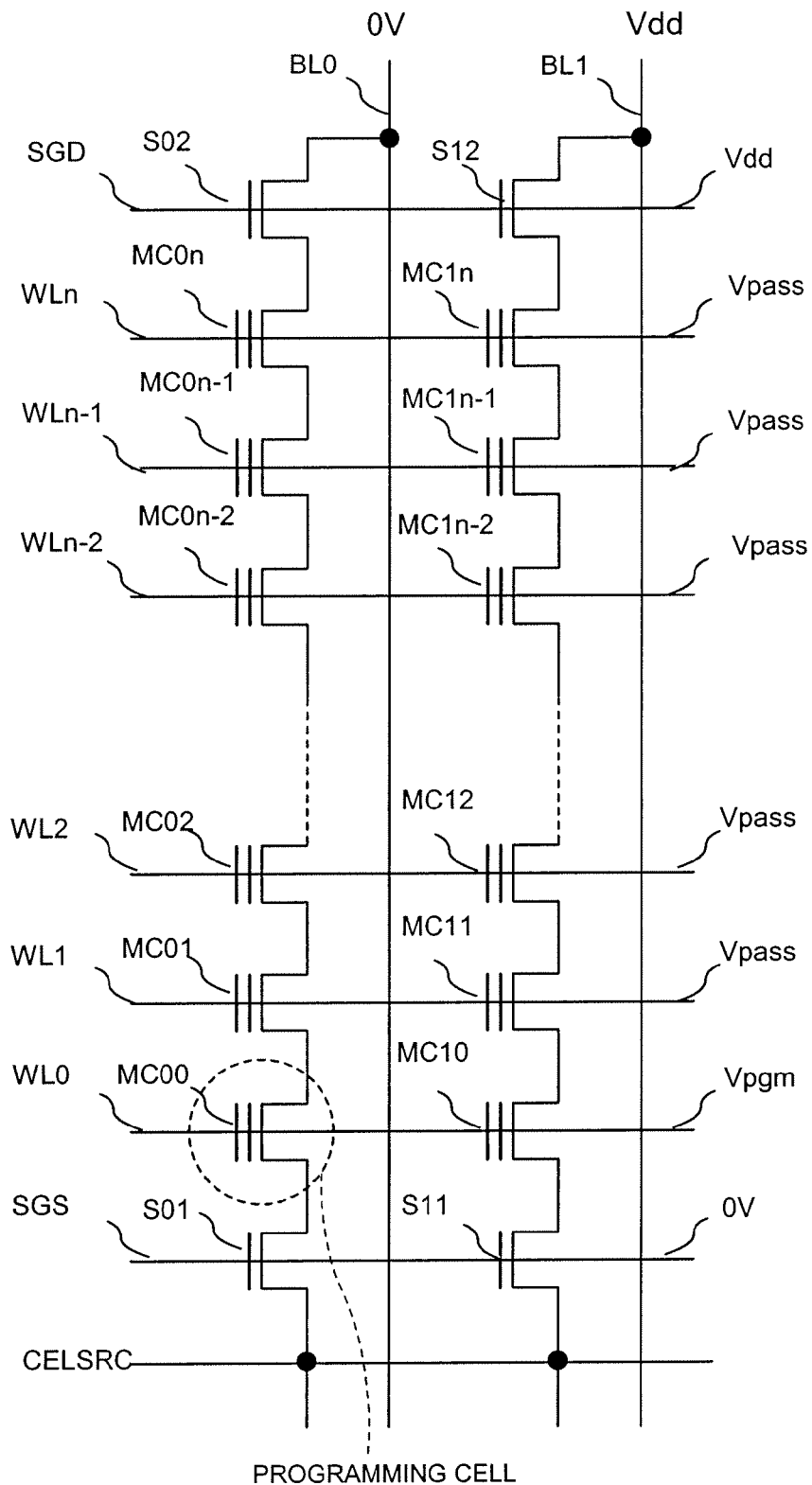
FIG. 4 is a drawing which shows one example of a condition of a voltage application to a NAND cell unit at the time of a programming operation related to an embodiment 1 of this invention.

FIG. 4 is a drawing which shows one example of a condition of a voltage application to a NAND cell unit at the time of a programming operation. A programming voltage Vpgm is applied to a selected word line WL0 which is to be programmed. A plurality of memory cells are arranged in series in one word line WL0, and programming is performed as one unit of one word line WL0. In the present invention it is sometimes necessary to appropriately call a word line to be programmed as a selected word line.

Excluding the word line WL0, a programming pass voltage Vpass is applied to all the non-selected word lines WL1 to WLn which are not to be programmed.

The programming voltage Vpgm is applied to the selected word line WL0 while stepping up using a pulse method at a voltage for example, of about 14V to 20V, so that the threshold range is controlled corresponding to programming data.

The select gate transistor 202 of the bit line BL0 side becomes a usual transistor construction which does not have a floating gate (FG) and a low voltage lower than a power supply voltage Vdd is applied to this gate. The select gate transistor S01 of the source line CELSRC side has the same construction as S02 and its gate potential is controlled to 0V.

The potential of the bit line BL0 which is to be programmed is controlled to 0V through the data register/sense amplifier circuit 13 as shown in FIG. 4. Then, when the memory cell on the selected word line WL0 which is to be programmed, is set to the desired threshold range and when programming is complete, a power supply voltage Vdd is applied to the bit line BL1 shown in FIG. 4 through the data register/sense amplifier circuit 13.

When programming, the voltage 0V which is applied to the bit line BL0 is transmitted to just before the select gate transistor S01. As a result, a channel of the memory cell MC00 to be programmed becomes 0V and a potential difference Vpgm occurs between the selected word line WL0 and the channel, the floating gate (FG0) 34 is injected with electrons by a Fowler-Nordheim tunneling current (FN) and the threshold (Vt) distribution is shifted to a positive side. On the other hand, excluding the selected word line WL0, a programming pass voltage Vpass in which a Fowler-Nordheim tunneling current (FN) hardly flows, is applied to all the non-selected word lines WL1 to WLn which are not to be programmed. Consequently, the threshold (Vt) distribution does not change.

Alternatively, when programming is completed or when not programming, because a power supply voltage Vdd is applied as is the bit line BL1 in FIG. 4, and because a low voltage slightly lower than Vdd is applied to the gate of the select gate transistor S12, the select gate transistor S12 becomes a cut-off state. By this, the channels of the memory cells MC10 to MC1n become a floating state. In this state, when Vpass or Vpgm is applied to the word line WL0 to WLn, because the channel potential of the memory cells MC10 to MC1n rises, FN tunneling current does not flow and it is possible to stop the threshold (Vt) distribution form shifting.

Below, a data programming method which controls the memory operation of multi-level data when the threshold of one memory cell of a memory chip in the above stated NAND type flash memory 1 is subdivided will be explained.

It is possible to change the electrons which are injected into the floating gate (FG) 34 shown in FIG. 3 by controlling the level of a programming voltage which is applied to a word line and also by controlling the amount of time of its application. The threshold level of a memory cell is changed in accordance with the amount of electrons that are injected into the floating gate (FG) 34 shown in FIG. 3 (a write operation). The memorization of multi-level data can be realized by changing the threshold level Vt of this memory cell in accordance with the data to be memorized. In the case of programming data to a memory cell, because there is a need to accurately control the threshold voltage of a memory cell in accordance with the data to be programmed, a programming method is executed whereby the voltage which is applied to the control gate of the memory cell is gradually increased. This type of programming method is called step up programming.

Figure 5:
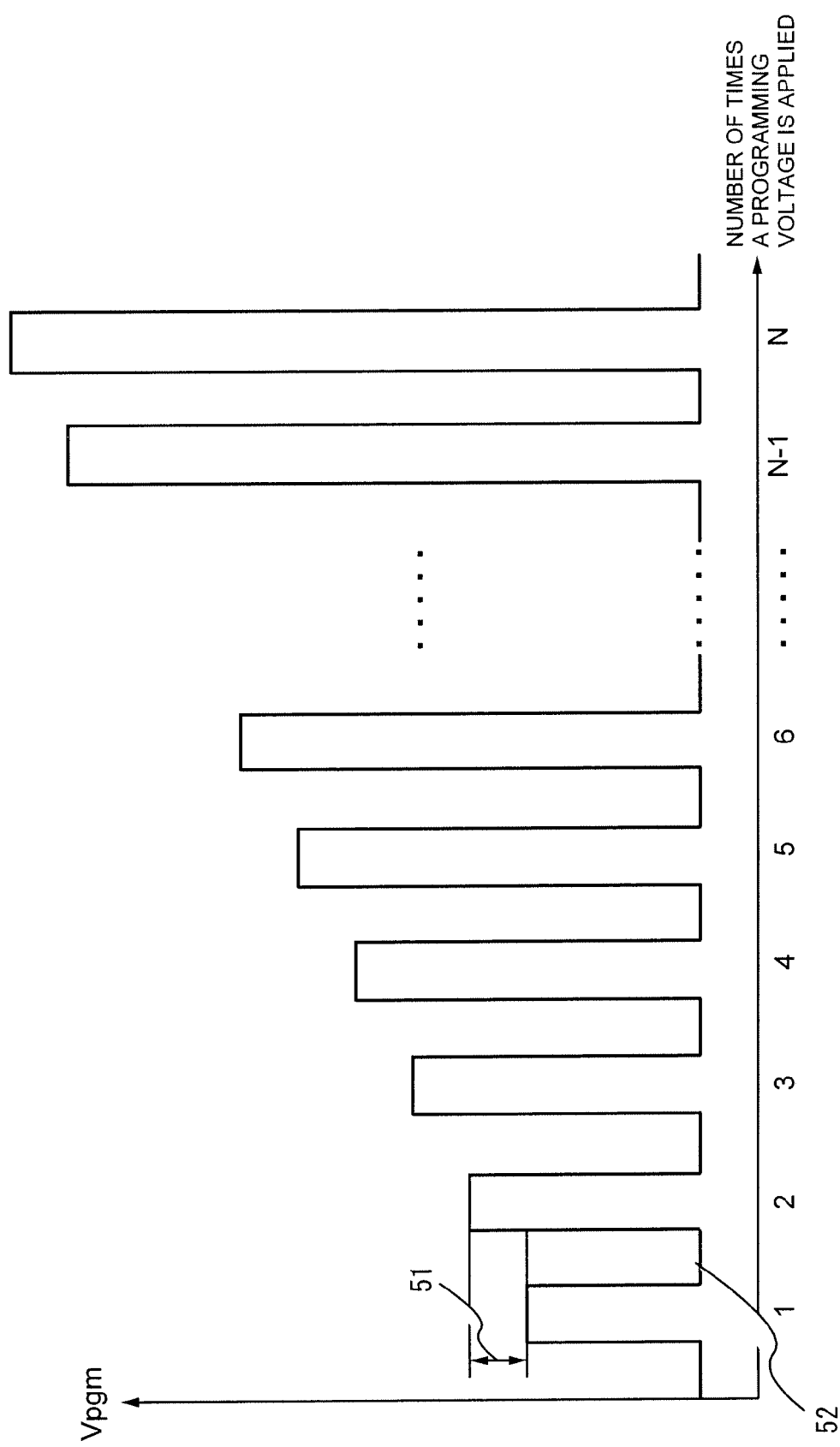
FIG. 5 is a drawing which shows one example of a step up programming method related to an embodiment 1 of this invention.

FIG. 5 is a drawing which shows one example of the step up programming method. FIG. 5 shows stepping up of the programming voltage Vpgm which is applied to one word line by a pulse operation. The vertical axis shows the programming voltage Vpgm and the horizontal axis shows the number of times (the number of times a programming voltage is applied) the pulse of the programming voltage Vpgm is applied to the word line WL. The width 51 of each step up of the programming voltage Vpgm is, for example, 0.2V. The pulse of the initial programming voltage Vpgm is, for example, 14V and the pulses of the programming voltage Vpgm thereafter are each stepped up by 0.2V. A verify operation takes place in the valley 52 between two peaks of a pulse.

The read voltage which is applied at the time of verify (verify level) is different depending on the programming threshold level. When the threshold level exceeds the verify level, because programming to that memory cell is completed, the potential of a bit line BL is controlled from 0V to Vdd.

In the case of multi-level data, programming is first completed from the data which has a low threshold level. For example, in the case where the threshold of one memory cell is divided into 16 and memorized, programming is completed in order from the lowest threshold level.

However, because there is variation in the thickness of a gate insulation film and coupling ratio in each memory cell, the memory cell can not be set within the same threshold level range by the application of a specific programming voltage. For example, in the case of setting (a memory cell) more than 1.0V threshold level, a 1.0V threshold level is set in a certain memory cell by applying a pulse three times, however, in another certain memory cell, by applying a pulse six times the threshold level voltage is set at 1.0V.

Figure 6:
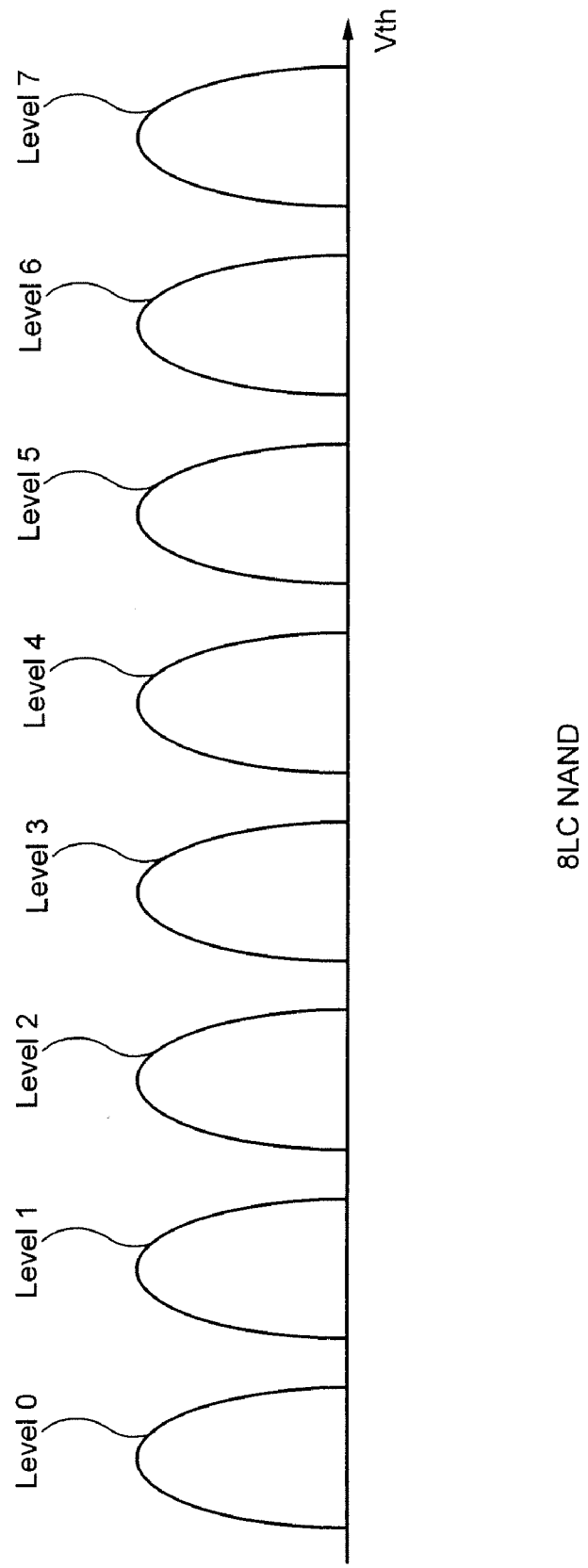
FIG. 6 is a drawing which shows a threshold distribution in the case of 8 levels related to an embodiment 1 of this invention.
Figure 7:
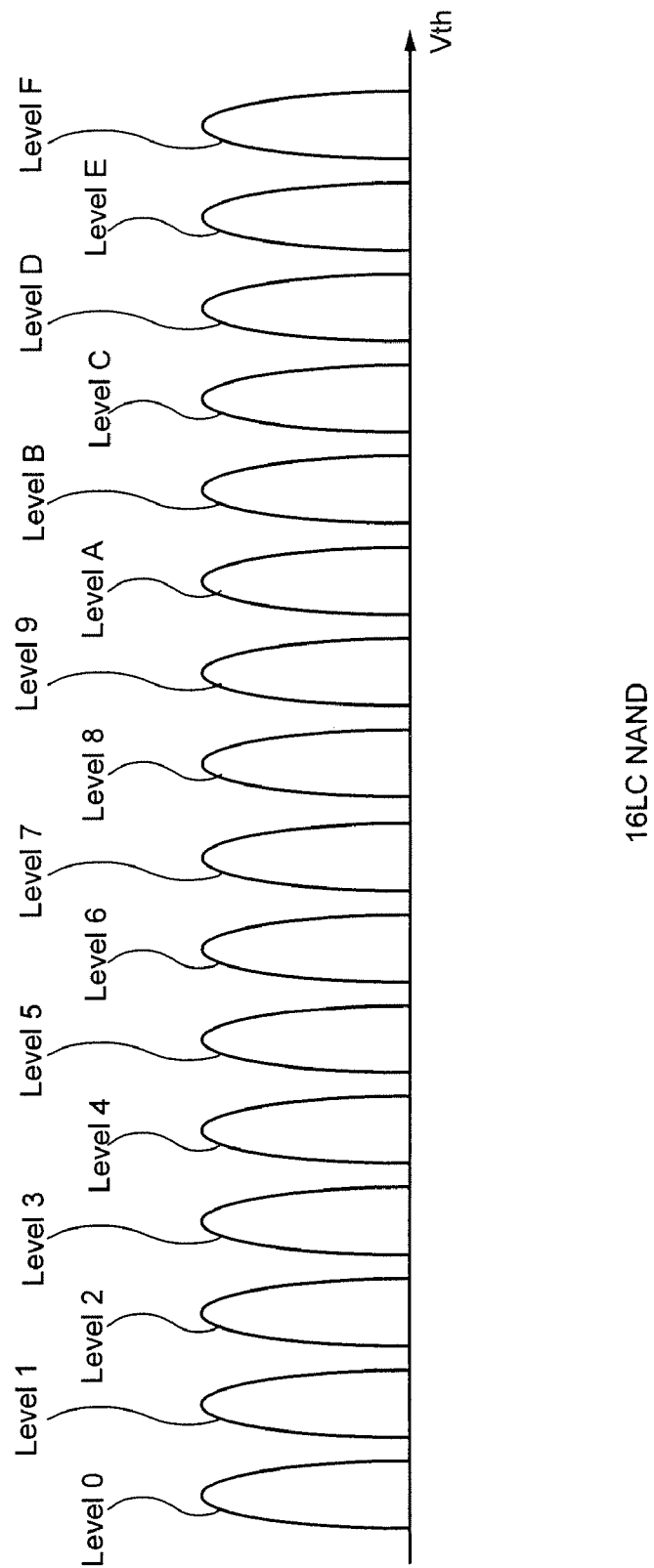
FIG. 7 is a drawing which shows a threshold distribution in the case of 16 levels related to an embodiment 1 of this invention.

FIG. 6 is a drawing which shows a threshold distribution in the case of 8 levels and FIG. 7 is a drawing which shows a threshold distribution in the case of 16 levels. In the case of 8 levels shown in FIG. 6, the threshold level is divided into 8 levels from Level 0 to Level 7. In the case of 16 levels shown in FIG. 7, the threshold level is divided into 16 levels from Level 0 to Level F. The threshold level of a memory cell is allocated according to the programming data level and under the multi-level memorization method which identifies memorization data, the threshold distribution of each level is narrowed and there is a need to enlarge the interval between each level.

In the multi-level memory method of 8 levels and 16 levels shown in FIG. 6 and FIG. 7 there is a need to distribute each threshold range into a narrower range. Consequently, when controlling the programming of data, the application of the programming voltage pulse is performed in small segments and each memory cell is checked whether a memory cell to be programmed has been the desired threshold range in the time between the end of the application of a programming voltage pulse and the beginning of the application of the next programming voltage pulse. Then, if there is memory cell which has not been sufficiently programmed, additional programming is performed to only that memory cell and a verify method is adopted to control optimum programming to each memory cell.

When a memory cell does not reach the desired threshold range, the programming voltage is stepped up and verify is performed again. This programming voltage step up operation and verify operation are repeated until the memory cell reaches the desired threshold range. Then, when the memory cell reaches the desired threshold range the programming operation is complete. In the present specification, this usual programming method is called a first programming method.

To this first programming method, the threshold distribution of each level is narrowed further and a programming method know as Quick Pass Write is used as a method for enlarging the interval between each level. In the present embodiment, this Quick Pass Write method is called a second programming method.

Figure 8:
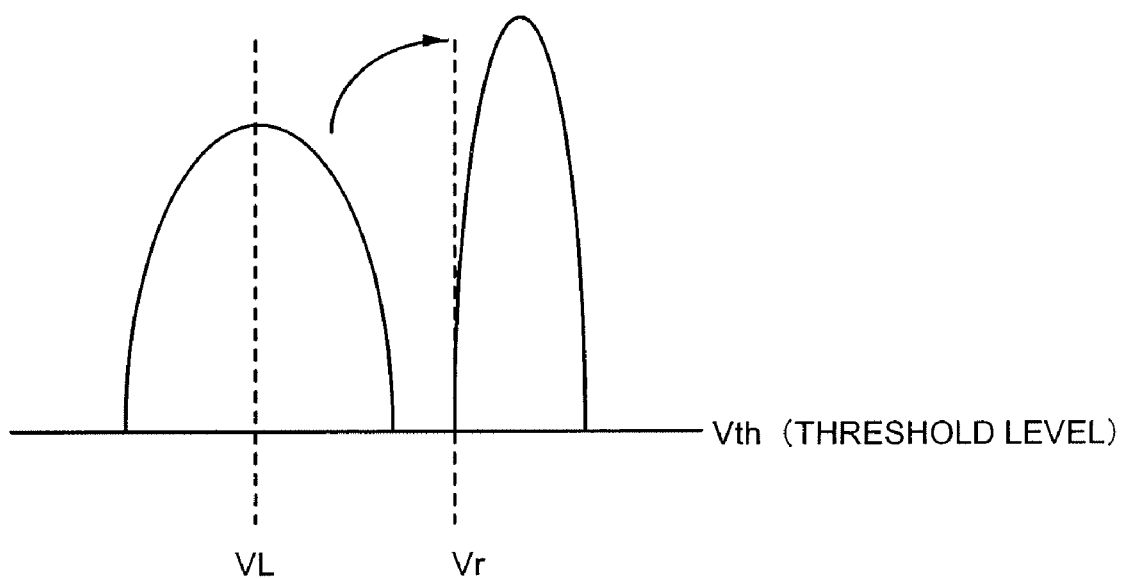
FIG. 8 is a drawing which shows a jump/transition of a threshold distribution in the case when a second programming method (Quick Pass Write) is used related to an embodiment 1 of this invention.
Figure 9:
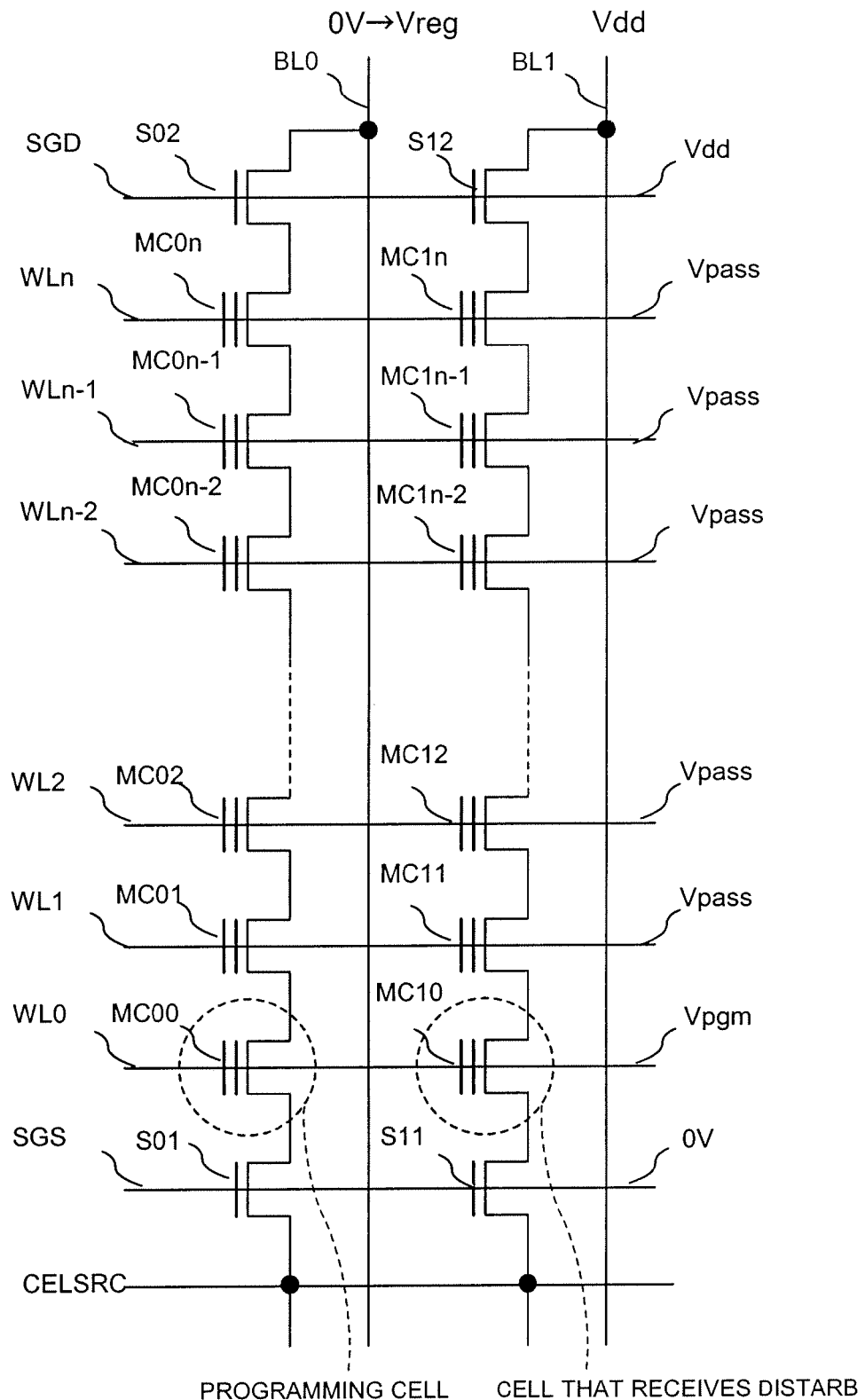
FIG. 9 is a drawing which shows a voltage application pattern in the case when a second programming method (Quick Pass Write) is used related to an embodiment 1 of this invention.

FIG. 8 is a drawing which shows the transition in a threshold distribution in the case where the second programming method (Quick Pass Write) is used. FIG. 9 is a drawing which shows a voltage application pattern in the case where the second programming method (Quick Pass Write) is used. Under the Quick Pass Write method, first, a low verify level voltage VL which is lower than a verify level Vr, is set at the time of a verify operation (low verify operation). Next, under the Quick Pass Write method, when the threshold of a memory cell to be programmed reaches the low verify voltage VL, the voltage of the bit line BL0 shown in FIG. 9 is set to an intermediate voltage Vreg from 0V. The intermediate voltage Vreg is controlled to a middle potential between 0V (first voltage) and power supply voltage Vdd (second voltage). Then, in the memory cell to be programmed the increased amount of electrons which are injected into a floating gate becomes gradual and the application of the programming voltage pulse and verify is slowly repeated until the verify level Vr is reached. By this programming operation, the threshold level of a memory cell to be programmed is set within the desired threshold range.

As is shown in FIG. 8, until the low verify voltage VL has been reached the threshold distribution spreads wide like the curve on the left side. When the threshold level exceeds the low verify voltage VL, the intermediate voltage Vreg which is an intermediate voltage between 0V and Vdd is applied to the bit line BL0 as is shown in FIG. 9. In this state, when a programming voltage pulse is applied to a memory cell to be programmed, the amount of increased electrons which are injected into the floating gate from the channel of that memory cell becomes gradual and the displacement of the threshold becomes gradual. The threshold distribution is finally set in a narrow distribution range like the curve in the right side of FIG. 8.

This Quick Pass Write method is able to further narrow a threshold distribution and a middle voltage between 0V (first voltage) and Vdd (second voltage) is applied as an intermediate voltage Vreg to a bit line BL and because the programming operation becomes slower than a first programming method a larger programming pulse is applied. As a result, a high voltage is applied for a long time to the same word line WL which is connected to the memory cell to be programmed. Consequently, the adjacent memory cell where programming has already completed receives program disturb stress.

The program voltage which is applied to a word line WL is a high voltage and program disturb stress is a phenomenon which shifts the threshold level of an adjacent memory cell in a high direction when programming of an adjacent memory cell on this same word line WL is finished and the threshold level is low. Particularly, it is easy for the memory cell MC10 which is near the select gate transistor S11 shown in FIG. 9, to receive the effects of program disturb. In FIG. 9 because the memory cell MC10 is set at a desired threshold level and programming is completed, Vdd is applied to the bit line BL1.

Because a voltage slightly lower than Vdd is applied to the select gate line SGD of the select gate transistor S12, the select gate transistor S12 is cut off. As a result, each channel of the memory cells MC10 to MC1n become a floating state and receive the effects of the programming voltage Vpgm which is applied to a word line WL and the programming pass voltage Vpass and the channel potential rises to about 8V for example.

Because the gate line SGS of the select gate transistor S11 which is connected to the source line CELSRC is 0V the select gate transistor S11 is cut off and the channel potential of the select gate transistor S11 becomes 0V. As a result, a potential difference occurs between the channel of the select gate transistor S11 and the channel of the memory cell MC10 and the electrons in the channel of the select gate transistor S11 flow into the channel of the memory cell MC10. These electrons are pulled by the programming voltage Vpgm which is applied to the gate of the memory cell MC10 and the phenomenon whereby the electrons are injected into the floating gate of the memory cell MC10 occurs. By this, because electrons are further injected into this floating gate of the memory cell MC10 in which programming has already completed, the threshold is displaced to higher direction. In this type of case when the threshold range which is first set is exceeded, the level of data which should be programmed can not be corresponded with the threshold level and there is a possibility that programming error may occur.

The higher the programming voltage and the longer the application of the programming voltage and the closer the memory cell to be programmed is to the select gate lines SGS and SGD, the large are the effects of program disturb stress.

Together with further narrowing of the threshold distribution, embodiment 1 shows the relief of excess stress caused by the second programming method (Quick Pass Write). In order to realize this the NAND type flash memory 1 of embodiment 1 reduces programming error which is caused by program disturb stress by using an algorithm which changes the second programming method (Quick Pass Write) to the first programming method (usual programming method) by a programming threshold level.

As stated above, the higher the programming voltage and the longer the application of the programming voltage and the closer the memory cell to be programmed is to the select gate lines SGS and SGD, the large are the effects of program disturb stress. Therefore, in a region where the programming voltage is comparatively low, the second programming method is selected so that the threshold distribution can be set narrower and when programming of a threshold level which exceeds a threshold level which is decided in advance, the first programming method which is a usual programming method, is selected.

Figure 10:
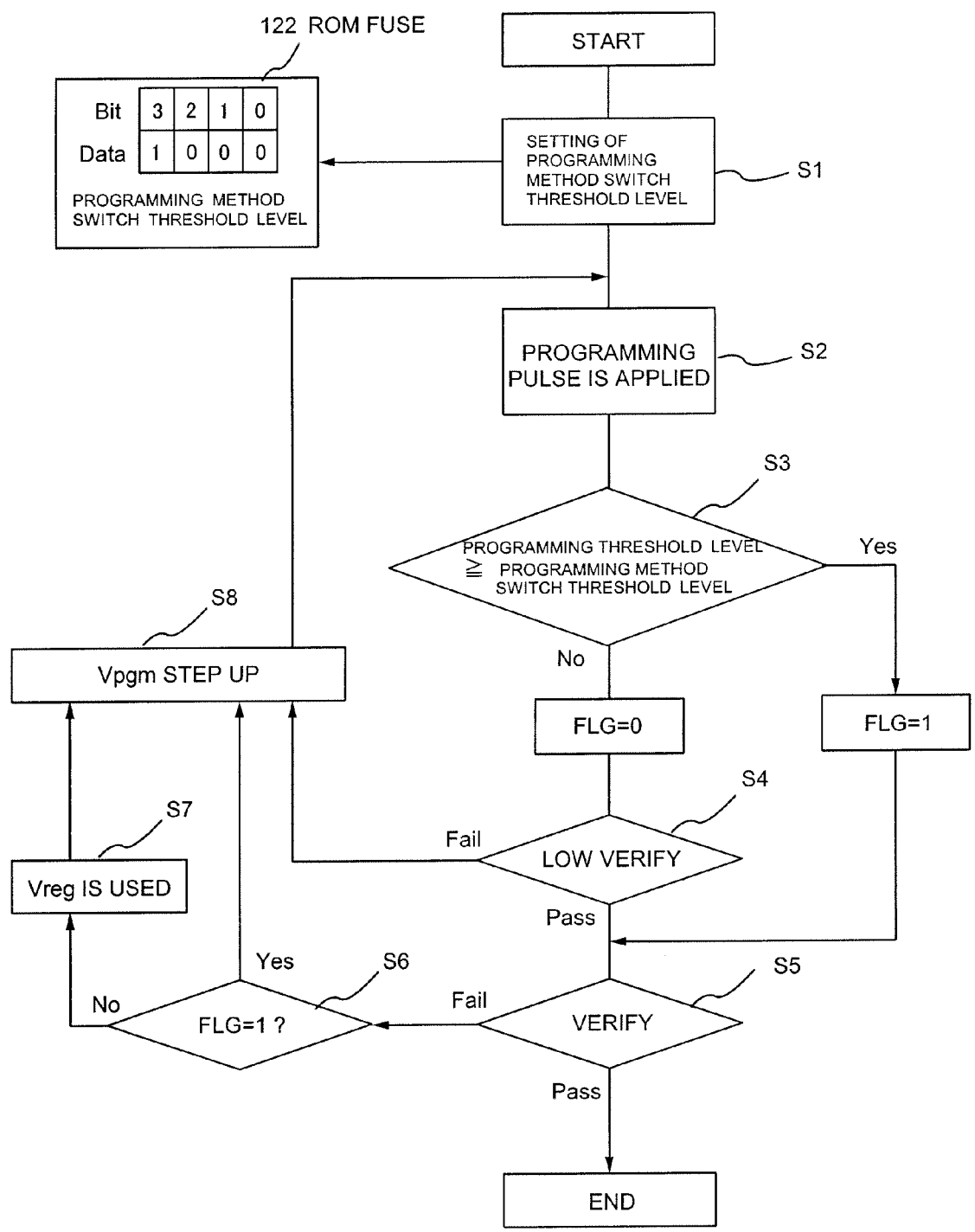
FIG. 10 is a flowchart which shows a programming method related to an embodiment 1 of this invention.

FIG. 10 is a flowchart which shows a programming method related to embodiment 1 of this invention. FIG. 10 is one example in the case of programming 16 levels. Below, a threshold level which is programmed to each memory cell on the same word line is called "a programming data threshold level" and a threshold level which switches from the second programming method to the first programming method is called "a programming method switch threshold level".

In step S1 shown in FIG. 10, the setting data of the programming method switch threshold level is stored in the ROM fuse 122 (threshold level storage section) shown in FIG. 1. The ROM fuse 122 may be programmed before the memory is shipped. In this case, when power is supplied to the NAND type flash memory 1, a power on reset circuit (not illustrated in the drawings) detects the introduction of the power supply. When the introduction of power is detected the control signal generation circuit 8, reads the setting data of the programming method switch threshold level from the data register/sense amplifier circuit 13, transmits to a parameter register 4 and stores.

16 levels which arrange 16 threshold ranges in one memory cell as is shown in FIG. 7, will be explained as an example. The 16 threshold ranges are named Level 0 to Level F in order from a low voltage range. In the ROM fuse 122 the setting values of threshold are set as Level 8 (1000) using 4 bit memory regions (Data) shown in FIG. 10. That is, in the case where data of more than Level 8 threshold levels among the 16 threshold levels Level 0 to Level F is programmed based on the data which is stored in the ROM fuse 122, programming control is performed using the first programming method, and in the case where data of a threshold level lower than the threshold level of Level 8, is programmed, programming control is performed using the second programming method.

In FIG. 10, the case which uses a 4 bit memory region in the ROM fuse 122 is shown, however for example, in the case of an 8 level NAND type flash memory a 3 bit memory region may be used and in the case of a 32 level NAND type flash memory a 5 bit memory region may be used.

In step S2 the pulse of the programming voltage Vpgm is generated by the voltage generation circuit 9 shown in FIG. 1 and applied to a word line WL of the memory cell array 12 through the row decoder 10. The programming voltage Vpgm which is applied first can be variable to according to the threshold level of data to be programmed. The programming voltage Vpgm which is applied first can be made 14V when the threshold level is −2V for example and 14.4V when the threshold level is −1V.

Next, in step S3, the control signal generation circuit 8 compares the threshold level of data to be programmed to a memory cell and the programming method switch threshold level which is based on the setting value set in step S1. FLG shown in the setting of the first programming method or the second programming method is set as below based on this comparison result.

In the example shown in FIG. 10, because the programming method switch threshold level which is set is Level 8, the second programming method is set as FLG=0 in the memory cell which is programmed with a threshold level lower than Level 8 and data is programmed by the second programming method. The first programming method is set as FLG=1 in the memory cell in which a threshold level more than Level 8 is programmed and data is programmed by the first programming method.

The comparison operation of the programming threshold level and the programming method switch threshold level in step S3 is explained below using a block drawing shown in FIG. 1. The setting data which shows the programming method switch threshold level which is memorized in the ROM fuse 122 is transferred to the data register/sense amplifier circuit 13. In addition, the data which shows the programming method switch threshold level which is memorized in ROM fuse 122 may be transferred to the parameter register 4, stored, further transferred to the control signal generation circuit 8 and stored.

The data of a threshold level which is programmed to each memory cell on a selected word line, in the case of 16 levels, is data which corresponds to each threshold level of the 16 divided levels Level 0 to Level F. This threshold level data is stored as programming threshold level data at the time of verify in the control signal generation circuit 8.

The control signal generation circuit 8 compares the data which corresponds to a programming threshold level of the stored levels Level 0 to Level F and the data of programming method switch threshold level which is transferred to the parameter register 4 from the above stated ROM fuse 122.

The specific comparison method in step S3 is outlined below. A comparison circuit 16 is arranged as shown in FIG. 1. A latch circuit (not shown in the drawings) which stores the data of the programming method switch threshold level which is transferred from the parameter register 4 is arranged in the comparison circuit 16. Further, the data of the programming method switch threshold level may be transferred directly to the comparison circuit 16 from the ROM fuse 122.

If for example there are 16 levels, the comparison circuit 16 is arranged with at least four latch circuits and the four latch circuits store 4 bits of data. Also, the comparison circuit 16 compares the data stored in the four latch circuits with the data of the programming method switch threshold level and a register (not shown in the drawings) is arranged which stores this comparison result. The comparison circuit 16 may be arranged inside the data register/sense amplifier circuit 13 or inside the control signal generation circuit 8 and may also be arranged as a comparison circuit 16 for external use.

Then, the comparison circuit 16 stores a comparison result between the data of the programming threshold level which is verified in the control signal generation circuit 8, with the data of the programming method switch threshold level which is stored in the parameter register 4, in an internal register (not shown in the drawings).

When the programming threshold level is lower than the programming method switch threshold level, the comparison result is given as FLG=0 and when the programming threshold level is higher than the programming method switch threshold level, the comparison result is given as FLG=1 and both results are stored in the internal register by the comparison circuit 16. After that a signal which shows the comparison result FLG=0 or FLG=1 is transferred to the control signal generation circuit 8 from the comparison circuit 16 and is stored. The control signal generation circuit 8 controls switching of a control method depending on whether the signal which shows this comparison result is FLG=0 or FLG=1.

In the example in FIG. 10, because the programming method switch threshold level is set at Level 8, a level which corresponds to Level 8 (1000) is stored in the latch circuits arranged in the comparison circuit 16.

When the programming threshold level is lower than Level 8, the comparison result is given as FLG=0 (step S3: Yes) and stored by the comparison circuit 16. After that, the signal which shows the comparison result FLG=0 is transferred to the control signal generation circuit 8 from the comparison circuit 16 and stored. Then, the control signal generation circuit 8 controls programming using the second programming method based on FLG=0.

In addition, when the programming threshold level is higher than Level 8, the comparison result is given as FLG=1 (step S3: No) and stored by the comparison circuit 16. After that, the signal which shows the comparison result FLG=1 is transferred to the control signal generation circuit 8 from the comparison circuit 16 and stored. Then, the control signal generation circuit 8 controls programming using the first programming method based on FLG=1.

<(Second Programming Method) when FLG=0>

In the case where the data which shows the comparison result FLG=0 is stored in the control signal generation circuit 8, that is, when the programming threshold level is lower than the programming method switch threshold level, the process shifts to step S4.

In step S4, the control signal generation circuit 8 generates a lower voltage low verify voltage VL than a usual verify voltage in the voltage generation circuit 9 and performs a low verify. In the case where the threshold of the memory cell to be programmed still does not reach this low verify voltage VL, the memory cell becomes Fail in FIG. 10 and the process shifts to step S8.

In step S8, the voltage generation circuit 9 shown in FIG. 1 steps up the programming voltage Vpgm by one step. Then, the process shifts to step S2 and the pulse of the programming voltage Vpgm which was stepped up is applied to a word line WL of the memory cell to be programmed through the row decoder 10.

In addition, in step S4, in the case where the threshold of the memory cell to be programmed exceeds the low verify voltage VL, the memory cell becomes Pass in FIG. 10 and the process shifts to step S5.

In step S5, the control signal generation circuit 8 generates a usual verify voltage Vr corresponding to the programming threshold in the voltage generation circuit 9 and performs a verify. In the case where the threshold of the memory cell to be programmed still does not reach this verify voltage Vr, the memory cell becomes Fail in FIG. 10 and the process shifts to step S6.

In step S6, when the programming threshold is lower than the programming method switch threshold level (when FLG=0), the process shifts to step S7.

In step S7, the bit line potential of a memory cell to be programmed is set as an intermediate voltage Vreg which is a middle voltage between 0V and Vdd from 0V. The voltage generation circuit 9 generates an intermediate voltage Vreg and supplies it to the data register/sense amplifier circuit 13. The data register/sense amplifier circuit 13 applies the intermediate voltage Vreg to a selected bit line BL.

In step S8, the voltage generation circuit 9 steps up the programming voltage Vpgm by one step. Then, the process shifts to step S2 and the pulse of the programming voltage Vpgm which is stepped up is applied to the select gate line of the memory cell to be programmed through the row decoder 10.

In step S5, on the other hand, in the case where the threshold of the memory cell to be programmed exceeds the verify voltage Vr, the memory cell becomes Pass as shown in FIG. 10 and programming is completed.

<(First Programming Method) when FLG=1>

In the case where the data which shows the comparison result FLG=0 is stored in the control signal generation circuit 8, that is, when the programming threshold level is higher than the programming method switch threshold level, the process shifts to step S5.

In step S5, the control signal generation circuit 8 generates a usual verify voltage Vr corresponding to the programming threshold in the generation circuit 9 and performs a low verify. In the case where the threshold of the memory cell to be programmed still does not reach this verify voltage Vr, the memory cell becomes Fail in FIG. 10 and the process shifts to step S6.

In step S6, when the programming threshold is higher than the programming method switch threshold level (when FLG=1), the process shifts to step S8.

In step S8, the voltage generation circuit 9 steps up the programming voltage Vpgm by one step. Then, the process shifts to step S2 and the pulse of the programming voltage Vpgm which is stepped up is applied to the selected word line of the memory cell to be programmed through the row decoder 10.

In step S5, in the case where the threshold of the memory cell to be programmed exceeds the verify voltage Vr, the memory cell becomes Pass in FIG. 10 and programming is completed.

The programming control which switches from the second programming method to the first programming method related to embodiment 1 of the present invention shown above, is applicable only to programming of the word line WL0 which is near the select gate line SGS shown in FIG. 9 and which can be easily affected by program disturb, while the remaining word lines WL1 to WLn−1 may be programmed using the second programming method.

In addition, the programming control which switches from the second programming method to the first programming method related to embodiment 1 of the present invention, is applicable only to the word lines WL0 and WLn which are near the select gate lines SGS and SGD shown in FIG. 9 and which can be easily affected by program disturb, while the remaining word lines WL1 to WLn may be programmed using the second programming method.

According to embodiment 1 of the present invention shown above, for example, in a nonvolatile semiconductor memory device with a multi-level memory method of 16 values, by programming using the second programming method when programming a threshold level lower than a certain threshold level (explained above as Level 8), it is possible to narrow the threshold distribution. And, by programming using the first programming method when programming a threshold level higher than a certain threshold level (explained above as Level 8), it is possible to reduce the influence to the threshold variation of an adjacent memory cell in which programming is completed.

Embodiment 2

In embodiment 2 of this invention, other example 1 of the second programming method is selected so that a threshold distribution can be further set narrowly in the case of programming a threshold level lower than a programming method switch threshold level which is decided in advance and when programming a threshold level higher than a programming method switch threshold level which is decided in advance, programming is carried out using a first programming method.

Figure 11:
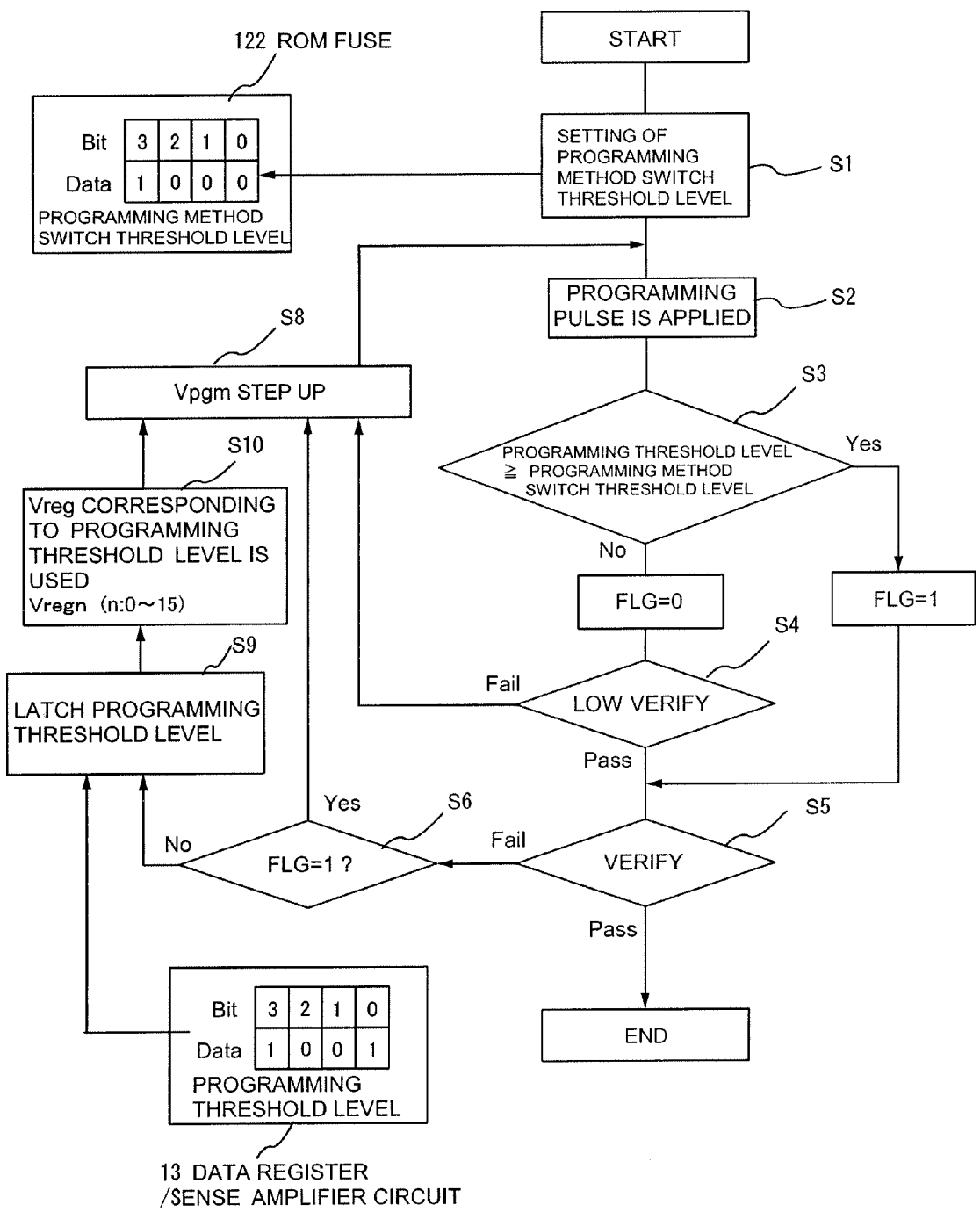
FIG. 11 is a flowchart which shows a programming method related to an embodiment 2 of this invention.

FIG. 11 is a flowchart which shows a programming method related to embodiment 2 of the present invention. FIG. 11 is one example in the case of programming 16 levels. In embodiment 2 of the present invention the selection method and means of programming and the first programming method is the same as in embodiment 1. The points in embodiment 2 which are different from embodiment 1 are that a different example 1 of the second programming method is used instead of the second programming method.

According to other example 1 of the second programming method, similar to the second programming method stated above, a low verify voltage VL is set as a potential lower than a verify level Vr. Then, when a threshold exceeds the low verify voltage VL, an intermediate voltage Vreg is applied to a bit line BL. However, unlike the second programming method, if the level of the intermediate voltage Vreg which is applied to a bit line BL is 16 levels, they are divided in 15 divides and selected according to the programming threshold level.

According to embodiment 2 of the present invention, in step S3 shown in FIG. 11, in the case when the programming threshold level is higher (FLG=1) than the programming method switch threshold level, the process shifts to step S5. The following uses the first programming method the same as in embodiment 1 shown in FIG. 10.

In addition, according to embodiment 2 of the present invention, in step S3, in the case when the programming threshold level is lower (FLG=0) than the programming method switch threshold level, the process shifts to step S4.

In step 4, the control signal generation circuit 8 shown in FIG. 1 generates a low verify voltage VL in the generation circuit 9 and performs a low verify. In the case where the threshold of the memory cell to be programmed still does not reach this verify voltage VL, the memory cell becomes Fail in FIG. 11 and the process shifts to step S8

In step S8, the voltage generation circuit 9 steps up the programming voltage Vpgm by one step. Then, the process shifts to step S2 and the pulse of the programming voltage Vpgm which is stepped up is applied to the selected word line of the memory cell to be programmed through the row decoder 10.

In step S4, in the case where the threshold of the memory cell to be programmed exceeds the low verify voltage VL, the memory cell becomes Pass in FIG. 11 and the process shifts to step S5.

In step S5, the control signal generation circuit 8 generates a usual verify voltage Vr corresponding to the programming threshold in the generation circuit 9 and performs a low verify. In the case where the threshold of the memory cell to be programmed still does not reach this verify voltage Vr, the memory cell becomes Fail in FIG. 11 and the process shifts to step S6.

In step S6, when the programming threshold is lower than the programming method switch threshold level (when FLG=0), the process shifts to step S8 and step S9.

In step 9, the potential of a bit line BL of a memory cell to be programmed is set as the intermediate voltage Vreg which is an intermediate potential between 0V and Vdd from 0V.

Step S9 and step S10 are steps which show the characteristics of example 1 of the second programming method.

According to example 1 of the second programming method, for example, in the case of programming of a low threshold level, the intermediate voltage Vreg is set high and applied to a bit line BL of a memory cell.

In addition, according to example 1 of the second programming method, in the case of programming a high threshold level, the intermediate voltage Vreg is set high and applied to a bit line BL of a memory cell.

The intermediate voltage which is used for example 1 of the second programming method is a middle potential between 0V and Vdd and is generated as a voltage which is divided into 15 divides in the voltage generation circuit 9 so that is corresponds to the programming threshold level Level 0 to Level E. Because the third programming voltage sets the intermediate voltage Vreg which is applied to a bit line BL narrower when compared to the second programming method, it is possible to further finely adjust the amount of electrons injected into a floating gate in accordance with the programming threshold level.

The 15 intermediate voltages Vreg which correspond to the programming threshold levels Level 0 to Level E, are supplied to the data register/sense amplifier circuit 13 from the voltage generation circuit 9.

The data of the threshold level which is programmed in each memory cell on a selected word line is transferred to the data register/sense amplifier circuit 13 from an I/O control circuit 2 and stored. In the case of 16 levels, data which corresponds to each threshold level of the levels Level 0 to Level E which are divided in to 16 divides is transferred. This programming threshold level is stored in a latch circuit (not shown in the drawings) of the data register/sense amplifier circuit 13.

In step S10, the control signal generation circuit 8 performs a control so that the 15 intermediate voltages Vreg which correspond to the programming threshold levels Level 0 to Level E stored in the control signal generation circuit 8, are supplied to the data register/sense amplifier circuit 13 from the voltage generation circuit 9. The data register/sense amplifier circuit 13 selects the intermediate voltages Vreg which correspond to the programming threshold levels Level 0 to Level E and apply it to a bit line BL of a memory cell.

Because the operation of all other steps are the same as those in embodiment 1 stated above, their explanation is omitted here. The programming control which switches from example 1 of the second programming method to the first programming method related to embodiment 2 of this invention shown above is applicable only to programming of the word line WL0 which is near the select gate line SGS shown in FIG. 9 and which can be easily affected by program disturb. The remaining word lines WL1 to WLn may be programmed using the second programming method.

In addition, the programming control which switches from example 1 of the second programming method to the first programming method related to embodiment 2 of this invention, is applicable only to programming of the word lines WL0 and WLn which are near the select gate lines SGS and SGD shown in FIG. 9 and which can be easily affected by program disturb. The remaining word lines WL1 to WLn−1 may be programmed using the second programming method.

According to embodiment 2 of the present invention shown above, for example, in a nonvolatile semiconductor memory device with a multi-level memory method of 16 values, by programming using example 1 of the second programming method when programming a threshold level lower than a certain fixed threshold level, it is possible to narrow the threshold distribution. In addition to this, when example 1 of the second programming method which is adopted in embodiment 2 of this invention is compared to the second programming method it is possible to further finely adjust the amount of electrons injected into a floating gate in accordance with the programming threshold level. And by programming using the first programming method when programming a threshold level higher than a certain threshold level it is possible to reduce the influence to the threshold variation of an adjacent memory cell in which programming is completed.

Embodiment 3

In embodiment 3 of the present invention other example 2 of the second programming method is selected so that a threshold distribution can be further set narrowly in the case of programming a threshold level lower than a programming method switch threshold level which is decided in advance and when programming a threshold level higher than a programming method switch threshold level which is decided in advance, programming is carried out using a first programming method.

Figure 12:
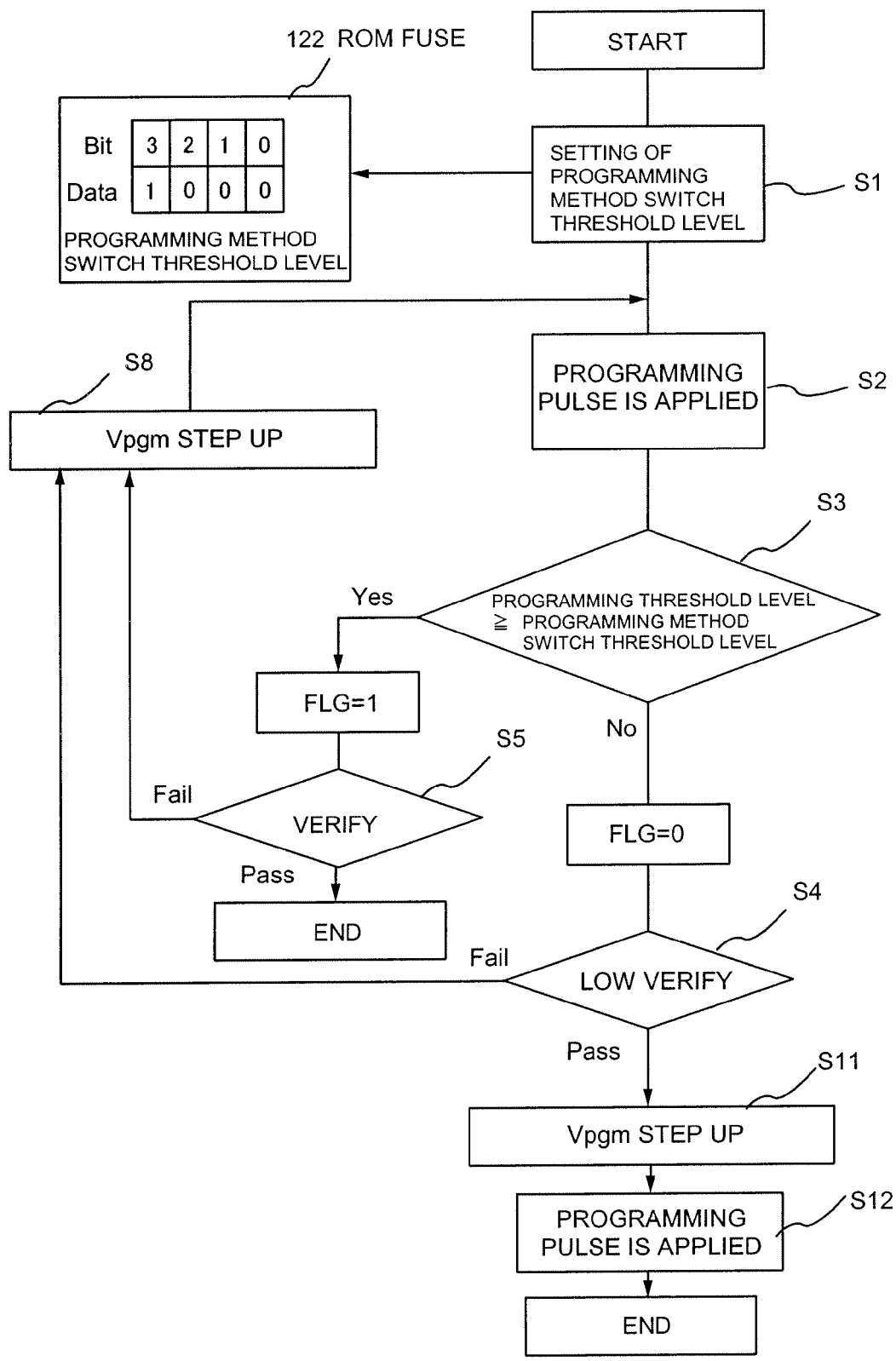
FIG. 12 is a flowchart which shows a programming method related to an embodiment 3 of this invention.

FIG. 12 is a flowchart which shows a programming method related to embodiment 3 of the present invention. FIG. 12 is one example in the case of programming 16 levels. In embodiment 3 of the present invention the selection method and means of programming and the first programming method are the same as in embodiment 1 and embodiment 2. The points in embodiment 3 which are different from embodiment 1 and embodiment 2 are that a different example 2 of the second programming method is used.

According to embodiment 3 of the present invention, in step S3 shown in FIG. 12, when the programming threshold level is higher (FLG=1) than the programming method switch threshold level, the process shifts to step S5. The following uses the first programming method the same as in embodiment 1 shown in FIG. 10.

According to embodiment 3 of the present invention, in step S3, when the programming threshold level is lower (FLG=0) than the programming method switch threshold level, the process shifts to step S4 and example 2 of the second programming method is used.

The example 2 of the second programming method will be explained below. In example 2 of the second programming method a low verify voltage VL lower than a verify level Vr is set in step S4, similar to the second programming method (Quick Pass Write). The low verify voltage VL corresponds to a programming threshold level. The low verify voltage VL is generated by the voltage generation circuit 9 shown in FIG. 1 and is applied to a word line WL through the row decoder 10.

According to example 2 of the second programming method, in step S4, a low verify is carried out and a threshold level is compared with a verify level. When the threshold level exceeds the low verify level voltage VL, the process shifts to step S11.

In step S11, the programming voltage Vpgm is stepped up only once. Then, in step S12, the programming voltage Vpgm which has been stepped up is applied to a word line WL and programming is completed.

After passing a low verify, because the programming voltage Vpgm is only stepped up once, it is preferred that the low verify voltage VL of example 2 of the second programming method is set at a low level which is closer to the verify level Vr than the low verify voltage of the second programming method.

In addition, after passing a low verify, because the programming voltage Vpgm is only stepped up once, there is a possibility that the threshold distribution slants to a low direction. However, the memory cell which receives program disturb has a low threshold level and because this threshold is displaced to a high potential, even if the threshold distribution slants to a low direction, it is possible to counterbalance to a certain extent the displacement caused by program disturb.

The programming control which switches from example 2 of the second programming method to the first programming method related to embodiment 3 of this invention shown above is applicable only to programming of the word line WL0 which is near the select gate line SGS shown in FIG. 9 and which can be easily affected by program disturb. The remaining word lines WL1 to WLn may be programmed using the second programming method.

In addition, the programming control which switches from example 2 of the second programming method to the first programming method related to embodiment 3 of this invention, is applicable only to programming of the word lines WL0 and WLn which are near the select gate lines SGS and SGD shown in FIG. 9 and which can be easily affected by program disturb. The remaining word lines WL1 to WLn−1 may be programmed using the second programming method.

According to embodiment 3 of the present invention shown above, for example, in a nonvolatile semiconductor memory device with a multi-level memory method of 16 values, programming is carried out using example 2 of the second programming method until programming of a certain fixed threshold level is completed and by programming using the first programming method when programming of a certain fixed threshold is completed it is possible to counterbalance the influence to the threshold variation of an adjacent memory cell in which programming is completed and accelerate programming time.

Embodiment 4

According to embodiment 1 and embodiment 3 of the present invention, the programming method switch threshold level which is set in advance is compared with the programming threshold level and a construction and a method for switching between programming methods is shown in step S3 shown in FIG. 10 and FIG. 12. In embodiment 4 of the present invention, however, a construction and a method for switching between programming methods is shown more easily by the number of step-up-times of a programming voltage.

Figure 13:
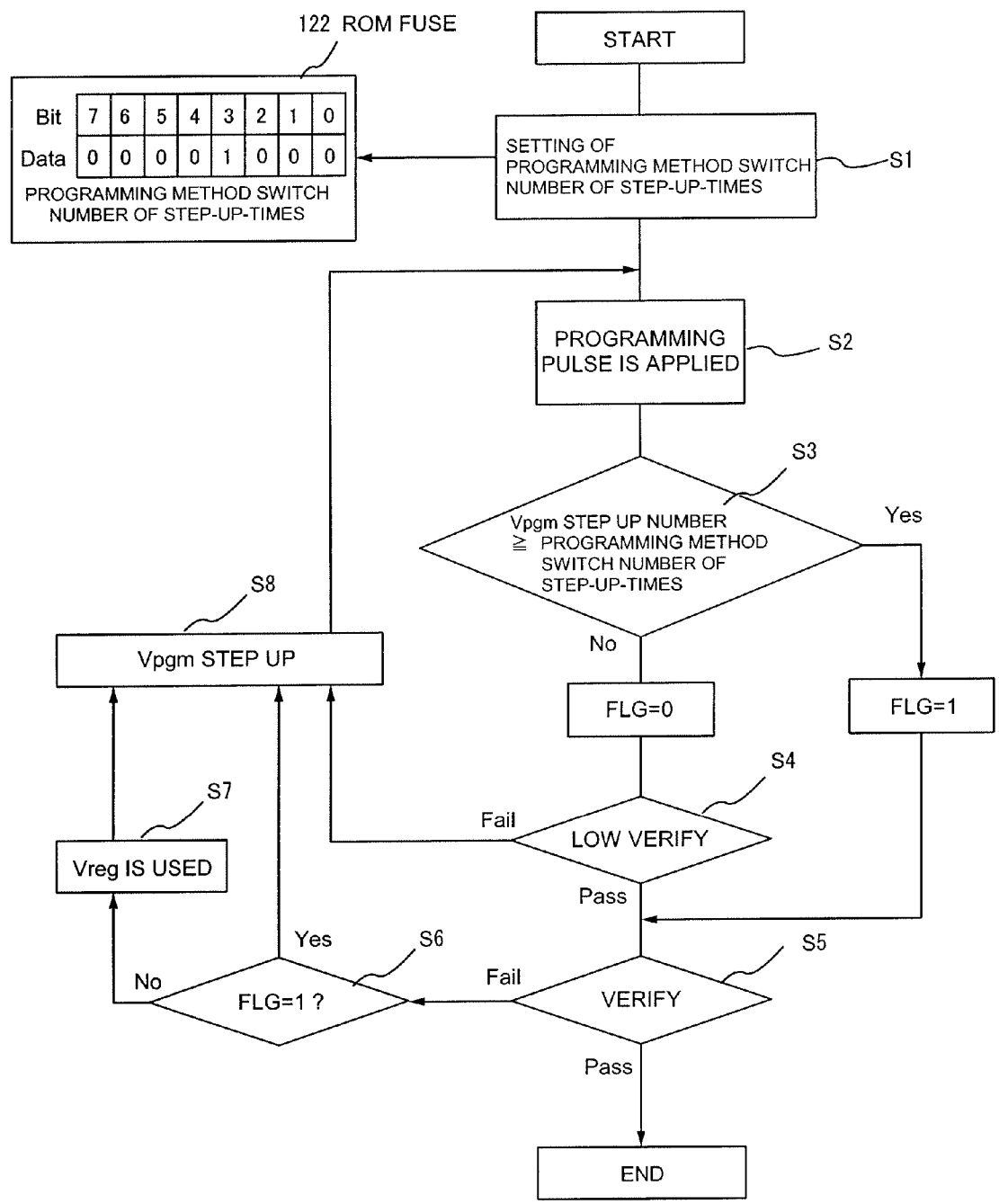
FIG. 13 is a flowchart which shows a programming method related to an embodiment 4 of this invention.

FIG. 13 is a flowchart which shows a programming method related to embodiment 4 of the present invention. FIG. 13 is one example in the case of programming 16 levels. A example 2 of the second programming method in embodiment 4 of the present invention is the same as in embodiment 1 to embodiment 3. The point in embodiment 4 which is different to embodiment 1 to embodiment 3 is that the number of step-up-times of a programming voltage which switches programming methods is set in advance (step S1). This is called programming method switch number of step-up-times. The number of step-up-times of a programming voltage Vpgm which is applied to a selected word line is counted (step S2). Then, until the number of step-up-times of programming voltage Vpgm reaches the programming method switch number of step-up-times which is set in advance stated above, the second programming method is selected, and when the number of step-up-times of programming voltage Vpgm reaches the programming method switch number of step-up-times which is set in advance, the programming method is switched to the first programming method (step S3 to step S8).

In step S1 shown in FIG. 13, the data value corresponding to the programming method switch number of step-up-times is stored in the ROM fuse 122 inside the NAND type flash memory 1 shown in FIG. 1. The data which is stored in the ROM fuse 122 uses larger bit data than the programming method switch number of step-up-times. In FIG. 13 8 bit data is used. A setting value is given as 8 counts (00001000). That is, programming control is carried out using the second programming method until the programming voltage is stepped up 8 times. When the programming voltage is stepped up more than 8 times programming control is carried out using the first programming method.

A counter circuit (not shown in the drawings) is arranged in the control signal generation circuit 8 and when the programming voltage Vpgm which is generated by the voltage generation circuit 9 is stepped up, the counted value is stored. This count value is transferred to the comparison circuit 16 and stored.

The data of the programming method switch number of step-up-times which is stored in the ROM fuse 122 is transferred to the parameter register 4 through the data register/sense amplifier 13 and stored and further transferred to the comparison circuit 16 and stored and transferred to the control signal circuit 8.

The comparison circuit 16 compares the above stated count value with the data of the programming method switch number of step-up-times and the comparison result is stored in a register.

In FIG. 13 the programming method switch number of step-up-times is set at 8 and 8 values (00001000) which corresponds to the programming method switch number of step-up-times 8 is stored in an 8 bit latch circuit arranged in the comparison circuit 16.

The comparison circuit 16 stores the comparison result as FLG=0 when the count value is less than 8 (step S3: No). After that, the signal which shows the comparison result FLG=0 is transferred to the control signal generation circuit 8 from the comparison circuit 16 and stored. Then, the control signal generation circuit 8 carries out programming control using the second programming method based on FLG=0 (step S4 and step S8).

The comparison circuit 16 stores the comparison result as FLG=1 when the count value is more than 8 (step S3: Yes). After that, the signal which shows the comparison result FLG=1 is transferred to the control signal generation circuit 8 from the comparison circuit 16 and stored. Then, the control signal generation circuit 8 carries out programming control using the first programming method based on FLG=1 (step S5 to step S8).

Further, in FIG. 13, an explanation of the steps S4 to S8 is omitted since they are the same as in embodiment 1.

The programming control which switches from the second programming method to the first programming method related to embodiment 4 of this invention shown above is applicable only to programming of the word line WL0 which is near the select gate line SGS shown in FIG. 9 and which can be easily affected by program disturb. The remaining word lines WL1 to WLn may be programmed using the second programming method.

In addition, the programming control which switches from the second programming method to the first programming method related to embodiment 4 of this invention, is applicable only to programming of the word lines WL0 and WLn which are near the select gate lines SGS and SGD shown in FIG. 9 and which can be easily affected by program disturb. The remaining word lines WL1 to WLn−1 may be programmed using the second programming method.

According to embodiment 4 of the present invention shown above, for example, in a nonvolatile semiconductor memory device with a multi-level memory method of 16 values, by programming using the second programming method when the number of step-up times of programming voltage Vpgm is less than the programming method switch number of set-up times, it is possible to narrow a threshold distribution. Then, by using the first programming method when the number of step-up times of programming voltage Vpgm is no less than the programming method switch number of set-up times, it is possible to reduce the influence to the threshold variation of an adjacent memory cell in which programming is completed.

Embodiment 5

Figure 14:
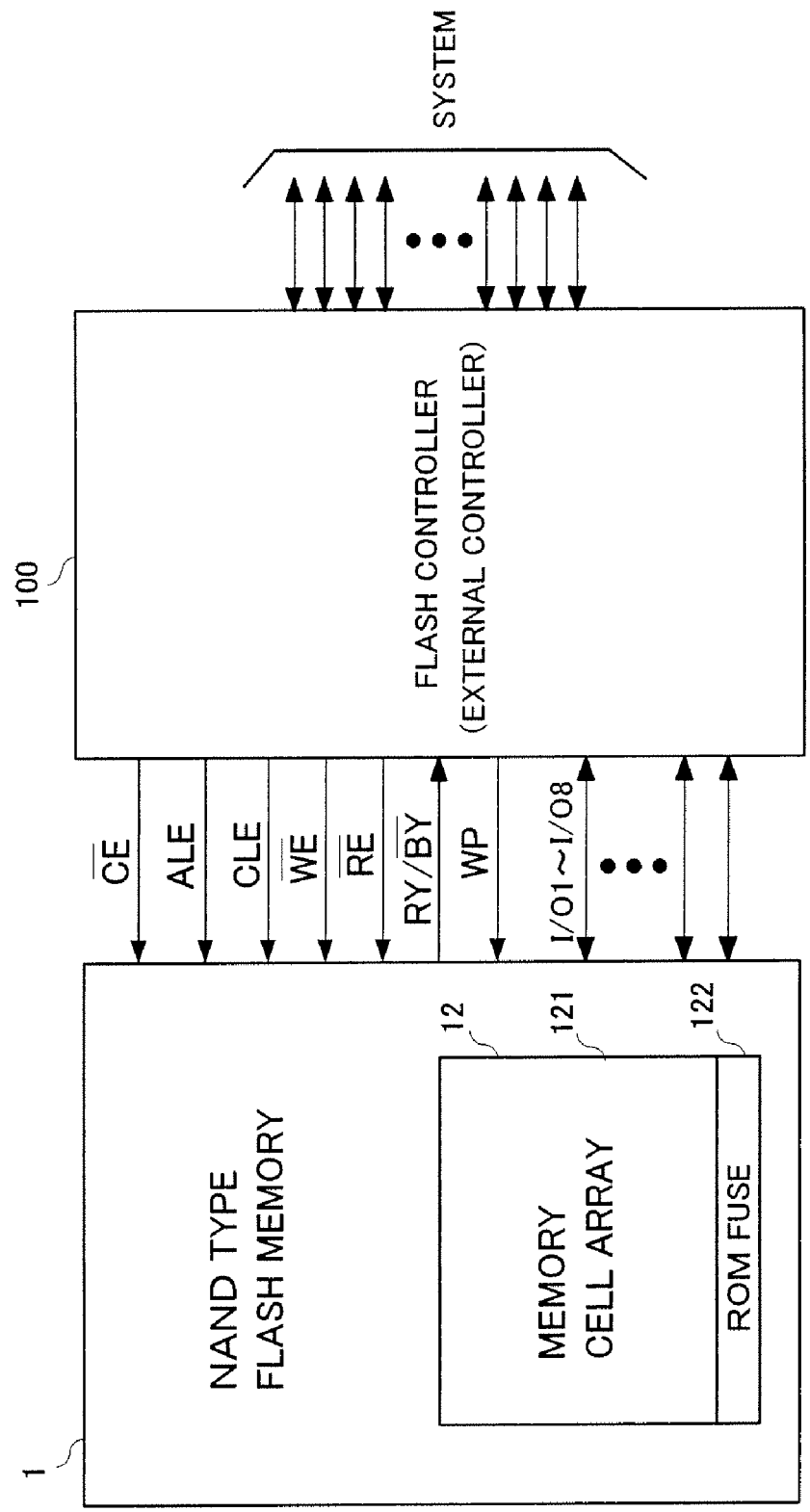
FIG. 14 is a flowchart which shows a programming method related to an embodiment 5 of this invention.

FIG. 14 is a block drawing which shows one example of a nonvolatile memory system related to embodiment 5 of this invention. Embodiment 5 shows the case where a nonvolatile memory is a NAND type flash memory 1 and a memory controller is an external controller (flash controller) 100.

As is shown in FIG. 14, the external controller 100 controls the NAND type flash memory 1. For example, the external controller 100 accesses a memory cell array 121 in accordance with a request from the external host, reads data, programs data and controls the erasure of data.

The NAND type flash memory 1 is arranged with a control pin and an input/output pin. The control pin is basically a pin for receiving a control signal from the external controller 100 and the input/output pin is basically a pin for sending and receiving data with the external controller 100, receiving commands from the external controller and sending a status to the external controller 100.

In embodiment 5 there are /CE (chip enable), ALE (address latch enable), CLE (command latch enable), /WE (write enable), /RE (read enable), RY//BY (ready/busy), /WP (write protect) etc for the control pin and I/O1-I/O8 etc for the input/output pin. These pins are connected to the external controller 100.

The nonvolatile memory system related to embodiment 5 of the present invention, is not the nonvolatile memory system explained in embodiments one to four where the data related to switching a programming method is memorized in the ROM fuse in advance but is a nonvolatile memory system which is arranged with the external controller 100 which changes externally the data related to switching a programming method in accordance with an external instruction.

According to embodiment 5 of the present invention stated above, it is possible to propose a nonvolatile memory system arranged with a means for reducing programming errors while narrowing a threshold distribution.

Further, according to embodiment 1 to embodiment 5, data of a threshold level which switches a programming method is stored in a ROM fuse, and a construction is shown which programming control switches a programming method based on this data, however, these constructions are not limited to these embodiments. For example, an alternative latch circuit (storage circuit) is arranged inside the NAND type flash memory 1 shown in FIG. 14 of embodiment 5. The data of a threshold level which switches a programming method is temporarily latched to this latch circuit and this data is made changeable from the external controller 100. That is, the NAND type flash memory 1 has a construction in which the data of a threshold level which switches a programming method can be changed externally by arranging a latch circuit. By adopting such a construction it is possible to appropriately change a threshold level which switches a programming method while considering the performance evaluation and programming characteristics of a cell before the NAND type flash memory is shipped. As a result, it is possible to propose a nonvolatile memory system which is mounted with a NAND type flash memory which can change a threshold level which switches a programming method and it is also possible to more effectively use a programming method switching function.

What is claimed is:

1. A nonvolatile semiconductor memory device comprising;
   a memory cell array including a plurality of electrically rewritable nonvolatile memory cells arranged in series, at least one of said memory cells storing data using a plurality of threshold levels;
   a threshold level storage section storing a programming method switch threshold level on which a first programming method and a second programming method are switched;
   a comparison circuit comparing said programming method switch threshold level with a programming data threshold level and outputting a comparison result;
   a control signal generation circuit setting said first programming method or said second programming method based on said comparison result and outputting a control signal corresponding to said first programming method or said second programming method; and
   a voltage generation circuit generating a programming voltage and an intermediate voltage which are applied to said at least one memory cell based on said control signal.

2. The nonvolatile semiconductor memory device according to claim 1,
   wherein said voltage generation circuit generates said intermediate voltage according to said programming data threshold level.

3. The nonvolatile semiconductor memory device according to claim 1,
   wherein said memory cell array includes a plurality of word lines being connected to control gates of said memory cells and a plurality of bit lines being connected to a drain side end of said serially-connected memory cells, and
   wherein said programming voltage is applied to at least one of said word lines and said intermediate voltage is applied to at least one of said bit lines according to said first programming method or said second programming method.

4. The nonvolatile semiconductor memory device according to claim 1,
   wherein said control signal generation circuit sets said first programming method in case said programming data threshold level is no less than said programming method switch threshold level and sets said second programming method in case said programming data threshold level is less than said programming method switch threshold level.

5. The nonvolatile semiconductor memory device according to claim 3,
   wherein in said first programming method, said programming voltage is applied to said at least one word line with a first voltage applied to said at least one bit line to execute a write operation or with a second voltage applied to said at least one bit line to execute a write-inhibit operation, and a verify voltage corresponding to said programming data threshold level is applied to said at least one word line to execute a verify operation, said second voltage is higher than said first voltage, and
   wherein in said second programming method, said programming voltage is applied to said at least one word line with said first voltage applied to said at least one bit line to execute said write operation, and a low verify voltage lower than said verify voltage corresponding to said programming data threshold level is applied to said at least one word line to execute a low verify operation, and after passing said low verify operation, said programming voltage is applied to said at least one word line with said intermediate voltage applied to said at least one bit line to execute said write operation, and said verify voltage corresponding to said programming data threshold level is applied to said at least one word line to execute said verify operation, said intermediate voltage is higher than said first voltage and lower than said second voltage.

6. The nonvolatile semiconductor memory device according to claim 5,
   wherein said memory cell array includes a first select gate line connected to a plurality of first select gate transistors adjacent to a source side end of said serially-connected memory cells and a second select gate line connected to a plurality of second select gate transistors adjacent to said drain side end of serially-connected memory cells, and
   wherein said memory cells connected to the word line adjacent to said first select gate line are programmed with switching said first programming method and said second programming method, and said memory cells connected to the word lines not adjacent to said first select gate line are programmed with said second programming method.

7. The nonvolatile semiconductor memory device according to claim 5,
   wherein said memory cell array includes a first select gate line connected to a plurality of first select gate transistors adjacent to a source side end of said serially-connected memory cells and a second select gate line connected to a plurality of second select gate transistors adjacent to said drain side end of serially-connected memory cells, and
   wherein said memory cells connected to the word line adjacent to said first select gate line or said second select gate line are programmed with switching said first programming method and said second programming method, and said memory cells connected to the word lines not adjacent to said first select gate line and said second select gate line are programmed with said second programming method.

8. The nonvolatile semiconductor memory device according to claim 3,
   wherein in said first programming method, said programming voltage is applied to said at least one word line with a first voltage applied to said at least one bit line to execute a write operation or with a second voltage applied to said at least one bit line to execute a write-inhibit operation, and a verify voltage corresponding to said programming data threshold level is applied to said word line to execute a verify operation, said second voltage is higher than said first voltage, and
   wherein in said second programming method, said programming voltage is applied to said at least one word line with said first voltage applied to said at least one bit line to execute said write operation, and a low verify voltage lower than said verify voltage corresponding to said programming data threshold level is applied to said at least one word line to execute a low verify operation, and after passing said low verify operation, said programming voltage is applied to said at least one word line with said intermediate voltage applied to said at least one bit line to execute said write operation, and said verify voltage corresponding to said programming data threshold level is applied to said at least one word line to execute said verify operation, said intermediate voltage is increased or decreased corresponding to said programming data threshold level within range of between said first voltage and said second voltage.

9. The nonvolatile semiconductor memory device according to claim 8,
wherein said memory cell array includes a first select gate line connected to a plurality of first select gate transistors adjacent to a source side end of said serially-connected memory cells and a second select gate line connected to a plurality of second select gate transistors adjacent to said drain side end of serially-connected memory cells, and
wherein said memory cells connected to the word line adjacent to said first select gate line are programmed with switching said first programming method and said second programming method, and said memory cells connected to the word lines not adjacent to said first select gate line are programmed with said second programming method.

10. The nonvolatile semiconductor memory device according to claim 8,
wherein said memory cell array includes a first select gate line connected to a plurality of first select gate transistors adjacent to a source side end of said serially-connected memory cells and a second select gate line connected to a plurality of second select gate transistors adjacent to said drain side end of serially-connected memory cells, and
wherein said memory cells connected to the word line adjacent to said first select gate line or said second select gate line are programmed with switching said first programming method and said second programming method, and said memory cells connected to the word lines not adjacent to said first select gate line and said second select gate line are programmed with said second programming method.

11. The nonvolatile semiconductor memory device according to claim 3,
wherein in said first programming method, said programming voltage is applied to said at least one word line with a first voltage applied to said at least one bit line to execute a write operation or with a second voltage applied to said at least one bit line to execute a write-inhibit operation, and a verify voltage corresponding to said programming data threshold level is applied to said at least one word line to execute a verify operation, said second voltage is higher than said first voltage, and
wherein in said second programming method, said programming voltage is applied to said at least one word line and said first voltage is applied to said at least one bit line to execute said write operation, and a low verify voltage lower than said verify voltage corresponding to said programming data threshold level is applied to said at least one word line to execute a low verify operation, and after passing said low verify operation, said programming voltage is once stepped up and applied to said at least one word line with said first voltage applied to said at least one bit line to execute said write operation.

12. The nonvolatile semiconductor memory device according to claim 11,
wherein said memory cell array includes a first select gate line connected to a plurality of first select gate transistors adjacent to a source side end of said serially-connected memory cells and a second select gate line connected to a plurality of second select gate transistors adjacent to said drain side end of serially-connected memory cells, and
wherein said memory cells connected to the word line adjacent to said first select gate line are programmed with switching said first programming method and said second programming method, and said memory cells connected to the word lines not adjacent to said first select gate line are programmed with said second programming method.

13. The nonvolatile semiconductor memory device according to claim 11,
wherein said memory cell array includes a first select gate line connected to a plurality of first select gate transistors adjacent to a source side end of said serially-connected memory cells and a second select gate line connected to a plurality of second select gate transistors adjacent to said drain side end of serially-connected memory cells, and
wherein said memory cells connected to the word line adjacent to said first select gate line or said second select gate line are programmed with switching said first programming method and said second programming method, and said memory cells connected to the word lines not adjacent to said first select gate line and said second select gate line are programmed with said second programming method.

14. A nonvolatile semiconductor memory device comprising:
a memory cell array including a plurality of electrically rewritable nonvolatile memory cells arranged in series, at least one of said memory cells storing data using a plurality of threshold levels;
a number of times storage section storing a programming method switch number of step-up-times on which a first programming method and a second programming method are switched;
a counter circuit counting a number of step-up-times when a programming voltage applied to said at least one memory cell is stepped up and outputting said number of step-up-times;
a comparison circuit comparing said number of step-up-times with said programming method switch number of step-up-times and outputting a comparison result;
a control signal generation circuit sets said first programming method or said second programming method based on a comparison result and outputting a control signal corresponding to said first programming method or said second programming method; and
a voltage generation circuit generating said programming voltage and an intermediate voltage which are applied to said at least one memory cell based on said control signal.

15. The nonvolatile semiconductor memory device according to claim 14,
wherein said control signal generation circuit sets said first programming method in case said number of step-up-times is no less than said programming method switch number of step-up-times, and sets said second programming method in case said number of step-up-times is less than said programming method switch number of step-up-times.

16. The nonvolatile semiconductor memory device according to claim 14,
wherein said control signal generation circuit includes said counter circuit.

17. The nonvolatile semiconductor memory device according to claim 14,
wherein said comparison circuit includes a register storing said comparison result.

18. A nonvolatile memory system comprising:
a memory cell array including a plurality of electrically rewritable nonvolatile memory cells arranged in series, at least one said memory cells storing data using a plurality of threshold levels;
a threshold level storage section storing a programming method switch threshold level on which a first programming method and a second programming method are switched;
a comparison circuit comparing said programming method switch threshold level with a programming data threshold level and outputting a comparison result;
a control signal generation circuit setting said first programming method or said second programming method based on said comparison result and outputting a control signal corresponding to said first programming method or said second programming method;
a voltage generation circuit generating a programming voltage and an intermediate voltage which are applied to said at least one memory cell based on said control signal; and
an external controller changing said programming method switch threshold level stored in said threshold level storage section according to a command inputted from an system apparatus.

19. The nonvolatile memory system according to claim 18,
wherein said memory cell array includes a plurality of word lines being connected to control gates of said memory cells and a plurality of bit lines being connected to a drain side end of said serially-connected memory cells, and
wherein said programming voltage is applied to at least one word line and said intermediate voltage is applied to at least one bit line according to said first programming method or said second programming method.

20. The nonvolatile memory system according to claim 19,
wherein said control signal generation circuit sets said first programming method in case said programming data threshold level is no less than said programming method switch threshold level and sets said second programming method in case said programming data threshold level is less than said programming method switch threshold level.

* * * * *